(12) United States Patent
Huang et al.

(10) Patent No.: US 7,928,735 B2
(45) Date of Patent: Apr. 19, 2011

(54) BATTERY PERFORMANCE MONITOR

(76) Inventors: Yung-Sheng Huang, Taipei (TW);
Andrew F. Kallfelz, Jamestown, RI (US)

( * ) Notice: Subject to any disclaimer, the term of this patent is extended or adjusted under 35 U.S.C. 154(b) by 345 days.

(21) Appl. No.: 12/071,277

(22) Filed: Feb. 19, 2008

(65) Prior Publication Data

US 2009/0027056 A1    Jan. 29, 2009

Related U.S. Application Data

(60) Provisional application No. 60/935,017, filed on Jul. 23, 2007.

(51) Int. Cl.
*G01N 27/416* (2006.01)
(52) U.S. Cl. ......... 324/426; 324/427; 324/432; 320/132
(58) Field of Classification Search .................. 324/426
See application file for complete search history.

(56) References Cited

U.S. PATENT DOCUMENTS

| | | |
|---|---|---|
| 3,781,658 A | 12/1973 | Godshalk |
| 3,852,732 A | 12/1974 | Yorksie et al. |
| 3,873,911 A | 3/1975 | Champlin |
| 3,876,931 A | 4/1975 | Godshalk |
| 3,909,708 A | 9/1975 | Champlin |
| 3,984,762 A | 10/1976 | Dowgiallo, Jr. |
| 4,025,916 A | 5/1977 | Arnold et al. |
| 4,052,717 A | 10/1977 | Arnold et al. |
| 4,193,025 A | 3/1980 | Frailing et al. |
| 4,193,026 A | 3/1980 | Finger et al. |
| 4,231,027 A | 10/1980 | Mann |
| 4,290,021 A | 9/1981 | Theron et al. |
| 4,333,149 A | 6/1982 | Taylor et al. |
| 4,361,809 A | 11/1982 | Bil et al. |
| 4,423,378 A | 12/1983 | Marino et al. |
| 4,423,379 A | 12/1983 | Jacobs et al. |
| 4,678,998 A | 7/1987 | Muramatsu |
| 4,697,134 A | 9/1987 | Burkum et al. |
| 4,719,428 A | 1/1988 | Liebermann |
| 4,743,855 A | 5/1988 | Randin et al. |
| 4,816,768 A | 3/1989 | Champlin |
| 4,825,170 A | 4/1989 | Champlin |
| 4,888,716 A | 12/1989 | Ueno |

(Continued)

FOREIGN PATENT DOCUMENTS

DE        3407409 C2    9/1985

(Continued)

OTHER PUBLICATIONS

Feder et al, Field and Laboratory Studies to Assess the State of Health of Valve-Regulated Lead Acid Batteries, IEEE (1992).

(Continued)

*Primary Examiner* — Edward Tso
*Assistant Examiner* — Ramy Ramadan
(74) *Attorney, Agent, or Firm* — Michael de Angeli

(57) ABSTRACT

Improvements both in the methods whereby existing techniques for determining the condition of a battery are communicated to a user (for example, to the owner of a private vehicle, or to the service manager of a fleet of vehicles), or the vehicle's operating system, and in the methods for evaluating the condition of the battery are disclosed. It has been discovered by the inventors that the difference in internal resistance of a fully charged battery as measured during charging and as measured after charging is greater for a battery in poor condition than for a new battery. The invention relates in part to instruments and corresponding methods for evaluating the condition of a battery utilizing this discovery.

16 Claims, 12 Drawing Sheets

U.S. PATENT DOCUMENTS

| | | | |
|---|---|---|---|
| 4,912,416 | A | 3/1990 | Champlin |
| 4,937,528 | A | 6/1990 | Palanisamy |
| 4,952,862 | A | 8/1990 | Biagetti et al. |
| 5,027,294 | A | 6/1991 | Fakruddin et al. |
| 5,047,722 | A | 9/1991 | Wurst et al. |
| 5,047,961 | A | 9/1991 | Simonsen |
| 5,049,803 | A | 9/1991 | Palanisamy |
| 5,061,898 | A | 10/1991 | Oram et al. |
| 5,124,627 | A | 6/1992 | Okada |
| 5,130,699 | A | 7/1992 | Reher et al. |
| 5,137,020 | A | 8/1992 | Wayne |
| 5,140,269 | A | 8/1992 | Champlin |
| 5,159,272 | A | 10/1992 | Rao et al. |
| 5,193,067 | A | 3/1993 | Sato et al. |
| 5,195,813 | A | 3/1993 | Brown |
| 5,206,097 | A | 4/1993 | Burns |
| 5,281,919 | A | 1/1994 | Palanisamy |
| 5,298,346 | A | 3/1994 | Gyenes |
| 5,315,228 | A | 5/1994 | Hess et al. |
| 5,321,627 | A | 6/1994 | Reher |
| 5,349,282 | A | 9/1994 | McClure |
| 5,349,535 | A | 9/1994 | Gupta |
| 5,357,203 | A | 10/1994 | Landau et al. |
| 5,381,096 | A | 1/1995 | Hirzel |
| 5,459,671 | A | 10/1995 | Duley |
| 5,469,042 | A | 11/1995 | Ruhling |
| 5,488,282 | A | 1/1996 | Hayden |
| 5,496,658 | A | 3/1996 | Hein et al. |
| 5,519,304 | A | 5/1996 | Andrieu et al. |
| 5,521,443 | A | 5/1996 | Imura |
| 5,555,498 | A | 9/1996 | Berra |
| 5,572,136 | A | 11/1996 | Champlin |
| 5,578,915 | A | 11/1996 | Crouch, Jr. et al. |
| 5,578,927 | A | 11/1996 | Perelle |
| 5,585,728 | A | 12/1996 | Champlin |
| 5,596,567 | A | 1/1997 | de Muro |
| 5,600,230 | A | 2/1997 | Dunstan |
| 5,606,242 | A | 2/1997 | Hull |
| 5,621,298 | A | 4/1997 | Harvey |
| 5,633,573 | A | 5/1997 | van Phuoc et al. |
| 5,703,464 | A | 12/1997 | Karunasiri |
| 5,705,929 | A | 1/1998 | Caravello et al. |
| 5,721,688 | A | 2/1998 | Bramwell |
| 5,751,217 | A | 5/1998 | Kchao et al. |
| 5,764,469 | A | 6/1998 | Slepian et al. |
| 5,821,756 | A | 10/1998 | McShane et al. |
| 5,828,218 | A | 10/1998 | Yokoo |
| 5,831,435 | A | 11/1998 | Troy |
| 5,895,440 | A | 4/1999 | Proctor et al. |
| 5,900,734 | A | 5/1999 | Munson |
| 5,963,012 | A | 10/1999 | Garcia |
| 5,973,499 | A | 10/1999 | Schulmann |
| 6,020,717 | A | 2/2000 | Kadouchi |
| 6,061,638 | A | 5/2000 | Joyce |
| 6,064,180 | A | 5/2000 | Sullivan |
| 6,072,300 | A | 6/2000 | Tsuji |
| 6,081,098 | A | 6/2000 | Bertness et al. |
| 6,097,193 | A | 8/2000 | Bramwell |
| 6,121,753 | A | 9/2000 | Walker et al. |
| 6,133,709 | A | 10/2000 | Puchianu |
| 6,184,656 | B1 | 2/2001 | Karunasiri |
| 6,201,373 | B1 | 3/2001 | Arai et al. |
| 6,242,891 | B1 | 6/2001 | Parsonage |
| 6,249,106 | B1 | 6/2001 | Turner et al. |
| 6,263,268 | B1 | 7/2001 | Nathanson |
| 6,268,732 | B1 | 7/2001 | Jones et al. |
| 6,271,647 | B2 | 8/2001 | Galbraith et al. |
| 6,313,608 | B1 | 11/2001 | Varghese et al. |
| 6,331,762 | B1 | 12/2001 | Bertness |
| 6,369,577 | B1 | 4/2002 | Cho |
| 6,392,414 | B2 | 5/2002 | Bertness |
| 6,411,912 | B1 | 6/2002 | Sack |
| 6,424,157 | B1 | 7/2002 | Gollomp |
| 6,466,026 | B1 | 10/2002 | Champlin |
| 6,469,511 | B1 | 10/2002 | Vonderhaar et al. |
| 6,469,512 | B2 | 10/2002 | Singh et al. |
| 6,531,875 | B2 | 3/2003 | Satake |
| 6,586,941 | B2 | 7/2003 | Bertness et al. |
| 6,611,774 | B1 | 8/2003 | Zaccaria |
| 6,633,165 | B2 | 10/2003 | Bertness |
| 6,677,759 | B2 | 1/2004 | Friel |
| 6,696,819 | B2 | 2/2004 | Bertness |
| 6,704,629 | B2 | 3/2004 | Huang |
| 6,737,831 | B2 * | 5/2004 | Champlin ............... 320/132 |
| 6,791,464 | B2 | 9/2004 | Huang |
| 6,806,716 | B2 | 10/2004 | Bertness et al. |
| 6,850,037 | B2 | 2/2005 | Bertness |
| 6,871,151 | B2 | 3/2005 | Bertness |
| 6,888,468 | B2 | 5/2005 | Bertness |
| 6,909,287 | B2 | 6/2005 | Bertness |
| 7,003,411 | B2 | 2/2006 | Bertness |
| 7,015,674 | B2 | 3/2006 | Vonder Haar |
| 7,058,525 | B2 | 6/2006 | Bertness et al. |
| 7,212,006 | B2 | 5/2007 | Huang |
| 7,663,344 | B2 * | 2/2010 | Le Gall et al. ............ 320/136 |
| 2003/0067221 | A1 | 4/2003 | Disser et al. |
| 2007/0222418 | A1 * | 9/2007 | Le Gall et al. ............ 320/136 |

FOREIGN PATENT DOCUMENTS

| | | |
|---|---|---|
| JP | 9061505 | 3/1997 |
| JP | 10056744 | 2/1998 |

OTHER PUBLICATIONS

Berndt et al, "Monitoring of Stationary Valve-Regulated Lead Acid Batteries" (IEEE, 1991).

Konya et al "A Deterioration Estimating System for 200-Ah Sealed Lead-Acid Batteries". IEEE (1994).

* cited by examiner

BATTERY PERFORMANCE MONITOR

CROSS-REFERENCE TO RELATED APPLICATION

This application claims priority from U.S. provisional patent application Ser. No. 60/935,017, filed Jul. 23, 2007.

FIELD OF THE INVENTION

This application relates generally to the field of evaluating the condition of batteries, in particular to evaluation of the state of charge and state of health of storage batteries used in environments where the batteries are subjected to varying loads and recharging sequences, for example in motor vehicle and marine applications.

BACKGROUND OF THE INVENTION

1. Overview

The safe and reliable operation of passenger vehicles, commercial trucks, military equipment, boats, aircraft, telecommunications equipment, electric vehicles, computer systems, and many other devices requires predictable and reliable performance of the batteries that are integrated into those systems. The present invention relates to battery monitoring equipment, more particularly to methods and apparatus for monitoring the condition of one or more batteries, and in particular for continuously monitoring performance characteristics of one or more batteries while the batteries are in use.

In the past it has been difficult to monitor the condition of the batteries used in such applications. One aspect of this difficulty relates to the many variables associated with battery systems, including dynamic and unpredictable duty cycles, loads, environments, connections, charging systems, battery age, battery to battery interactions, etc. In addition to the difficulty associated with monitoring battery systems subject to such variables, in many applications there is difficulty in conveniently installing a monitoring system. This difficulty relates to the remote location of the battery or batteries compared to the location of the operator. For example, in an automobile, the battery may be located in the engine compartment, while the operator, or the system that can benefit from battery performance information, is located in the cabin. This presents a wiring problem, especially if such a system is to be installed in a preexisting vehicle. Difficulties are also associated with distinguishing between a battery in good condition that happens to be discharged and a battery that has reached or is nearing the end of its useful lifespan. Finally, batteries are used in different circumstances that demand different monitoring techniques; more specifically, different techniques are appropriate for monitoring batteries used in engine starting service, which requires high currents drawn for short periods, than for batteries used in "deep-cycle" applications, wherein relatively lesser currents are typically drawn for longer periods.

More particularly, in many battery applications, for example, automotive and marine applications, it is useful and important for the vehicle system and the operator to understand the state of charge ("SOC") of the battery, sometimes called the charge level, and the state of health ("SOH") of the battery, sometimes called the battery life. SOC is often expressed as a percentage, such that a battery at 100% SOC is considered to be fully charged and a battery at 0% SOC is considered to be completely discharged. SOH is also commonly expressed as a percentage such that a battery exhibiting 100% SOH is considered to be new, and a battery at 0% SOH has reached the end of its useful life, being able only to store at full charge a fraction of the energy (typically set at 60%) it could store when new.

In particular, a class of automobiles commonly called stop-start vehicles automatically shut off the engine when the vehicle is slowing down or at rest at a traffic light, for example. When the vehicle is at rest with the engine turned off, all vehicle systems such as headlights, air conditioning, media equipment, etc. are being powered by the battery. When the driver wishes to accelerate, the vehicle automatically commands the engine to start so the vehicle can continue driving. The automatic engine control systems (ECS) in such vehicles require very accurate SOC information as the system must always ensure that there remains enough energy in the battery to start the engine. Based on SOC information, the ECS will allow the engine to be automatically turned off if it is determined that enough battery energy remains. Similarly, if SOC falls below a pre-determined threshold the ECS may command the engine to start in order to charge the battery even if the driver has not applied the accelerator.

SOH information is also important, primarily so as to allow the battery to proactively be replaced when it reaches the end of its useful life, rather than fail inconveniently while the vehicle is being used. More specifically, SOH measures the ability of a battery to store energy, which decreases as the battery ages. The SOH of a battery is derived by comparing the amount of energy the battery can store when fully charged compared to the amount of energy the battery could store when new. For example, a new battery of 100 ampere-hours (Ah) capacity may be considered to have reached end of life (SOH=0%) when it can only store 60 Ah of energy when fully charged.

Thus, for proper operation of a start-stop vehicle (and in many other battery applications), the SOH and SOC must be accurately evaluated to ensure that the battery always contains sufficient energy to function properly in the system.

2. Terminology

Different segments of the battery and related industries use the same terms, particularly "capacity", differently; so that this application can be clearly understood, we define the following terms as indicated.

Present Capability ("Ca")—A measure of the amount of energy stored by a battery at any given time.

Maximum capability ("Cm")—A measure of the maximum amount of energy storable by a battery at any point over its entire lifespan.

Effective capability ("Ce")—A measure of the maximum amount of energy storable by a battery at a given point in its lifespan.

End-of-life capability ("Ceol")—A measure of the amount of energy storable by a battery at the end of its useful lifespan.

Thus, when a battery is in peak condition (typically shortly after entering service, as discussed further below) and is fully charged, its present capability Ca is equal to its effective capability Ce, and this is equal to its maximum capability Cm.

Over time, a battery's effective capability Ce decreases with respect to its maximum capability Cm; the relationship of Ce to Cm is termed the battery's state of health ("SOH"). When its effective capability Ce is equal to its end-of-life capability Ceol, it is considered to be beyond use. Ceol may be set arbitrarily, e.g., to 0.6 Cm. In order to express SOH as a percentage, such that SOH=100% when Ce=Cm and SOH=0% when Ce=Ceol, Ce−Ceol is divided by Cm−Ceol and multiplied by 100.

At any given time, a battery may be partially discharged, so that its present capability Ca is somewhat less than its effective capability Ce; the relationship of Ce to Ca is termed the battery's state of charge ("SOC"). As above, SOC can be expressed as a percentage by Ca/Ce×100.

3. Description of Related Art

The field of battery testing has been very active and many different technologies for evaluating various aspects of the condition of a battery have been developed. The principal approaches taken by the art are first categorized briefly below, for the purpose of describing the shortcomings of the various approaches, such that the benefits of the battery evaluation technologies used in the preferred embodiment of this invention can be readily appreciated.

Traditional methods for evaluating various different aspects of the condition of a battery include:

1. Establishing a pre-determined predicted voltage discharge curve for the battery, measuring the voltage between its terminals, and comparing the measured voltage to the pre-determined voltage discharge curve to determine its state of charge (SOC). This is referred to as "voltage sensing".
2. Applying a heavy load to the battery, and measuring the voltage drop across its terminals. This method is referred to as "load testing".
3. Establishing a reference point for the energy stored in a battery, measuring the current flowing into and out of the battery over time, typically by measuring the voltage drop across a shunt resistance or coil, and then estimating the total remaining energy compared to the reference point. This method is often referred to as "coulomb counting" or "current integration", typically performed using a "VIT (voltage-current-temperature) sensor".
4. Measuring the "dynamic conductance" of a battery by applying a time varying small amplitude AC signal to the battery for a period of time and measuring the voltage response, and then calculating the "dynamic conductance" of the battery based thereon; this value may be corrected with reference to the voltage across the battery, which is taken as indicative of its state of charge. See Champlin U.S. Pat. Nos. 3,909,708 and 4,912,416.

The voltage sensing method mentioned first above has many shortcomings. First, the voltage curve of every battery model is unique and thus the reference curve must be specifically matched to a single battery model. Second, the actual discharge profile changes as the battery ages. Third, the discharge profile changes based on the size of the load. Lastly, the measured voltage will be significantly affected by the load (or charger) applied to the battery. For example, a fully-charged battery with a large load applied will display a low voltage, so that the battery will erroneously be deemed to be discharged.

The "load testing" method described second above, as typically practiced in the prior art, has the shortcoming, among others, of requiring significant current to be drawn from the battery, interfering with the accuracy of the measurement, and discharging and possibly damaging the battery.

The current shunt, "VIT", or "coulomb counting" method mentioned third above also has many shortcomings. Most importantly, this method does not directly measure the level of energy in the battery, but only monitors the flow of energy into and out of the battery, and uses this data to measure departure from a prerecorded reference value. Over even a few discharge/recharge cycles the resulting estimation of capability drifts substantially and quickly from the actual energy in the battery due to inefficiencies associated with battery charging and discharging that cannot be measured or accurately estimated. Devices implementing this method are also large and cumbersome to install and connect.

More specifically, the "stop/start" vehicles discussed above require very accurate information concerning the SOC of their batteries. This has been attempted using VIT sensors. As above, VIT sensors measure current flow in and out of the battery, typically by measuring the voltage drop across a highly accurate shunt resistance while also measuring temperature. This data is sent to the vehicle computer or is analyzed by the sensor and SOC is evaluated by a process called current integration or coulomb counting. To achieve useful SOC results the sensor or vehicle computer must include a significant amount of detail about the battery and how it will be charged and discharged. This is necessary because the results of current integration must always be adjusted for factors that have large impacts on stored energy in the battery, but which cannot be measured by the current sensor. Such factors may include battery size, temperature sensitivity, rate capability, and other factors. Even with such detail, VIT sensors and the process of current integration over time are inherently prone to accumulated errors. While a VIT sensor may provide a highly accurate indication of SOC at the start of a measurement cycle, errors accumulate and can become substantial after 10 or 20 discharge cycles and often get worse as the battery ages.

In addition to being prone to accumulated error problems, because of the specific nature of the correction algorithms it is not possible to simply apply a VIT sensor to any battery in any application and expect to get useful SOC or SOH information. These shortcomings limit the application of VIT sensor technology to very specific applications for which the sensor has been programmed. These limitations are problematic for car makers and makers of other equipment that offer many models of equipment with many different batteries. Furthermore, the customers may use the products in many different ways and may replace the battery with respect to which the sensor was calibrated to function with different battery models available in the aftermarket. In each case the VIT technology is incapable of accurately measuring SOC.

The "AC signal" or "dynamic conductance" method mentioned lastly above also has significant shortcomings. The most significant shortcoming is that while the battery is in use, it will often be connected to loads or chargers producing noise or having components that respond to the applied AC signal. Thus, the measured voltage response will include significant distortion associated with devices attached to the battery. This deficiency makes it very difficult for this method to be used for accurately determining the condition of a battery while it is being used.

The prior art includes many patents directed to battery monitoring and evaluation. Exemplary approaches are disclosed in the following:

Tsuji U.S. Pat. No. 6,072,300 relates to characterization of the individual batteries of a large set of batteries. Internal resistance is estimated from cell voltage. See Col. 5, lines 32-38.

Fakruddin U.S. Pat. No. 5,027,294 also characterizes battery condition based on measurements of voltage.

Arai U.S. Pat. No. 6,201,373 shows a circuit for measuring the state of charge (SOC) of a battery, not a battery condition evaluation device per se. Voltage and current are both sampled.

Hirzel U.S. Pat. No. 5,381,096 also relates to SOC measurement.

Satake U.S. Pat. No. 6,531,875 teaches estimating the open circuit voltage of a battery based on extrapolation from a series of measurements.

Disser et al. US Patent Pub. No. 2003/0067221 A1 shows voltage regulator circuitry for automotive use.

Yokoo U.S. Pat. No. 5,828,218 shows a method for estimating residual capacity of a battery based on discharge current and voltage during discharge.

Munson U.S. Pat. No. 5,900,734 shows a battery monitoring system wherein the battery voltage is compared to a fixed reference value and an alarm is given when the battery voltage is less than the reference value.

Bramwell U.S. Pat. Nos. 5,721,688 and 6,097,193 discuss various methods of measuring the internal resistance and/or impedance of a battery, including application of a small AC signal to the battery and using a Wheatstone bridge or equivalent to measure the internal resistance. See col. 1, lines 40-48. Bramwell's claimed method includes the steps of measuring the impedance of a battery by sourcing to or sinking from the battery a current of known magnitude at intervals while the vehicle sits. Col. 9, lines 18-50.

Turner et al. U.S. Pat. No. 6,249,106 shows a circuit for preventing discharge of a battery beyond a predetermined point. Yorksie et al. U.S. Pat. No. 3,852,732 is directed toward the same objective. Finger et al. U.S. Pat. No. 4,193,026 is directed to measuring the SOC of a battery by integrating a signal indicative of reduction of the terminal voltage below a threshold value.

Reher et al. U.S. Pat. No. 5,130,699 shows a device for monitoring a battery by measuring the terminal voltage at regular intervals, comparing the measured values to a predetermined value, and setting a flag in a shift register depending on the result. When a predetermined number of flags indicate an under-voltage condition an alarm is given.

Sato et al. U.S. Pat. No. 5,193,067 discloses determining the internal impedance of a battery by measuring the voltage during discharge of a predetermined current, or by measuring the current during discharge at a predetermined voltage.

Slepian U.S. Pat. No. 5,764,469 shows disconnecting electronic equipment of a vehicle when the battery voltage falls below a predetermined level.

Gollomp et al. U.S. Pat. No. 6,424,157 refers to the difficulty of measuring battery SOC from open-circuit voltage (OCV) because this requires that the battery be disconnected. Gollomp instead teaches monitoring of the quiescent voltage (QV), e.g., measured at 30 minute intervals while the vehicle sits. Col. 9, lines 18-50. An alarm message can be given when QV falls below a predetermined point Col. 11, lines 28-39. Gollomp also teaches monitoring of voltage and current during engine starting (see FIG. 6). This data is stored in memory, see Col. 12, lines 48-50, and used to determine internal resistance (IR) and polarization resistance (PR). Gollomp also teaches monitoring SOC and QV over time to determine when the battery will not be able to start the car; see FIG. 3, Col. 14, line 22—Col. 16, line 36. Gollomp also teaches storing the first IR value of the battery, or some subsequent one, for "future use"—e.g., determination of IR change over time. PR is similarly monitored over time; see Col. 17, line 12- Col. 18, line 35. The result is to give warning of incipient battery failure or some problem with connections or the like. These data can be monitored during successive starts; see claim 1.

Kchao U.S. Pat. No. 5,751,217 shows a method and circuit for assessing battery impedance, which is stated to be applicable only to fully charged batteries, see Col. 3, lines 49-55, and Col. 4, line 12, and which is intended to be incorporated in a battery charger. By comparison, the apparatus of the invention is not limited to fully charged batteries and can be economically provided as a stand-alone unit or installed in a vehicle.

As noted above, it is also known to evaluate the condition of a battery by measurement of its "dynamic conductance", that is, the inverse of its internal "dynamic resistance", by applying a time-varying, small-amplitude AC signal to the battery for a period of time and measuring the voltage response, and then calculating the "dynamic conductance" of the battery based thereon; this value may be corrected with reference to the voltage across the battery, which is taken as indicative of its state of charge. See Champlin U.S. Pat. Nos. 3,909,708 and 4,912,416. However, this method is not suitable for measuring the dynamic conductance of a battery in use in the typically electronically "noisy" automotive environment.

Bertness U.S. Pat. No. 6,633,165 addresses measurement of the "cranking state of health" and "reserve state of health" of a battery by monitoring certain parameters of a battery, apparently preferably the dynamic conductance as measured according to the Champlin patents mentioned above.

U.S. Pat. No. 6,791,464 to Huang, one of the present inventors, incorporated herein by this reference, shows evaluation of the condition of a motor vehicle's battery by monitoring the voltage across the battery during starting, while the starter provides a substantial load. The minimum voltage reached during starting can be compared to a predetermined value to evaluate the condition of the battery.

U.S. Pat. No. 6,704,629 is also to Huang, and is also incorporated herein by this reference. According to the method disclosed in the Huang '629 patent, which can be considered a refinement of the known "load testing" technique described above, a relatively large known load is applied to a battery for a very short time. The voltage change and current flow associated with the very short transient load are measured. The DC internal resistance of the battery can be directly calculated from the voltage change and the current flow during the application of the known load. As the DC internal resistance is directly related to the remaining energy in the battery, this method directly measures battery capability. This method also eliminates the distorting effect of noise associated with connected equipment, and thus is considerably more useful than the AC signal method.

Commonly assigned U.S. Pat. No. 7,212,006 also to Huang, and also incorporated herein by this reference, relates to a method and apparatus for monitoring the condition of a battery by measuring its internal resistance (IR). The method involves measuring no-load voltages across the battery and a known load, connecting the load, measuring the loaded voltages, and determining IR based thereon. The method is capable of measuring the internal resistance of a battery while installed in an operational vehicle, that is, despite the presence of charge sources, such as an alternator, on the one hand, and loads on the other.

Commonly-assigned pending U.S. patent application Ser. No. 11/984,669 entitled "Method and Apparatus for Monitoring the Condition of a Battery By Measuring Its Internal Resistance", incorporated herein by this reference, also to Huang, shows a further improvement in techniques for evaluating IR of a battery with respect to those disclosed in U.S. Pat. No. 7,212,006. This method involves connecting different known loads across the battery, measuring the load and battery voltages, and determining IR therefrom. Some of the methods and instruments disclosed herein requires measurement of IR of a battery during and after charging, and preferably employ the techniques disclosed in Ser. No. 11/984, 669 for doing so, as discussed in detail below.

OBJECTS OF THE INVENTION

As indicated above, there are many areas in which existing techniques and equipment for battery evaluation can be improved.

Accordingly, one object of the invention is to provide a low-cost battery monitor that can readily be retrofit to an existing vehicle, and that is capable of communicating battery status information to, for example, the operator, or to a remote location such as the office of a vehicle fleet manager, to enable proactive measures to be taken where needed.

Another object of the invention is to provide an instrument providing an accurate value for SOC, and that is self-calibrating so as not to be susceptible to long-term drift. Still further, it is an object of the invention to provide such an instrument that is capable of "self-learning" the characteristics of the battery, avoiding the necessity of having the battery characteristics input thereto on installation.

Another object of the invention is to provide such an instrument that can additionally provide an indication of the battery SOH, so that incipient battery failure can be predicted and thereby avoided.

Another object of the invention is to provide an instrument for determining the SOH of a battery that would provide an accurate evaluation of its condition, independent of its SOC, and not requiring manual input of nominal characteristics of a comparable new battery of similar specifications for comparison. Such an instrument would be most useful in evaluating used batteries for warranty claims and the like.

Another object of the invention is to provide a "smart" battery charger, that is, a battery charger capable of accurately evaluating the condition of a battery, in order to adjust the charging parameters accordingly, and further to provide an output indicating that the battery has reached the end of its useful life, when appropriate.

Other objects of the invention will appear below.

SUMMARY OF THE INVENTION

The present application discloses improvements both in the methods whereby existing techniques for determining the condition of a battery (such as those disclosed in the Huang US patents and application referred to above) are communicated to a user (for example, to the owner of a private vehicle, or to the service manager of a fleet of vehicles), or the vehicle's operating system, and in the methods for evaluating the condition of the battery. This application also relates to communication of vehicle performance and condition data, that is, in addition to battery condition data per se, to a user. The invention also relates to integration of a battery monitor according to the invention with a battery charger, such that optimized battery charging can be effected.

The invention also relates to methods and devices whereby the characteristics of the battery can first be determined in a "self-learning" step and whereby the SOC of a battery can thereafter be accurately tracked in a "self-calibrating" process. Further, the SOH of the battery can likewise be accurately determined without the requirement of input of data concerning the battery's nominal characteristics.

The invention also relates to an important discovery that has been made by the inventors concerning the manner in which the internal resistance of a battery can be analyzed to evaluate its condition. More specifically, it has been discovered by the inventors that the internal resistance of a fully charged battery as measured while being charged differs from the value thereof as measured when the battery is fully charged, but after charging. Moreover, it has been found that the difference between these two values of the internal resistance is indicative of the condition (SOH) of the battery. Still more particularly, it has been discovered that the difference in internal resistance of a fully charged battery as measured during charging and as measured after charging is greater for a battery in poor condition than for a new battery. Accordingly, the invention relates to an instrument and corresponding method for evaluating the condition of a battery utilizing this discovery.

BRIEF DESCRIPTION OF THE DRAWINGS

The invention will be better understood if reference is made to the accompanying drawings, in which:

FIGS. 1(A) and 1(B), shows respectively a graph showing typical variation in the available capability of a battery over time, illustrating the manner in which the device of the invention is effectively self-learning and self-calibrating, and four exemplary views of a battery "fuel gauge" display provided in one embodiment of the invention;

DESCRIPTION OF THE PREFERRED EMBODIMENTS

Figure 1:
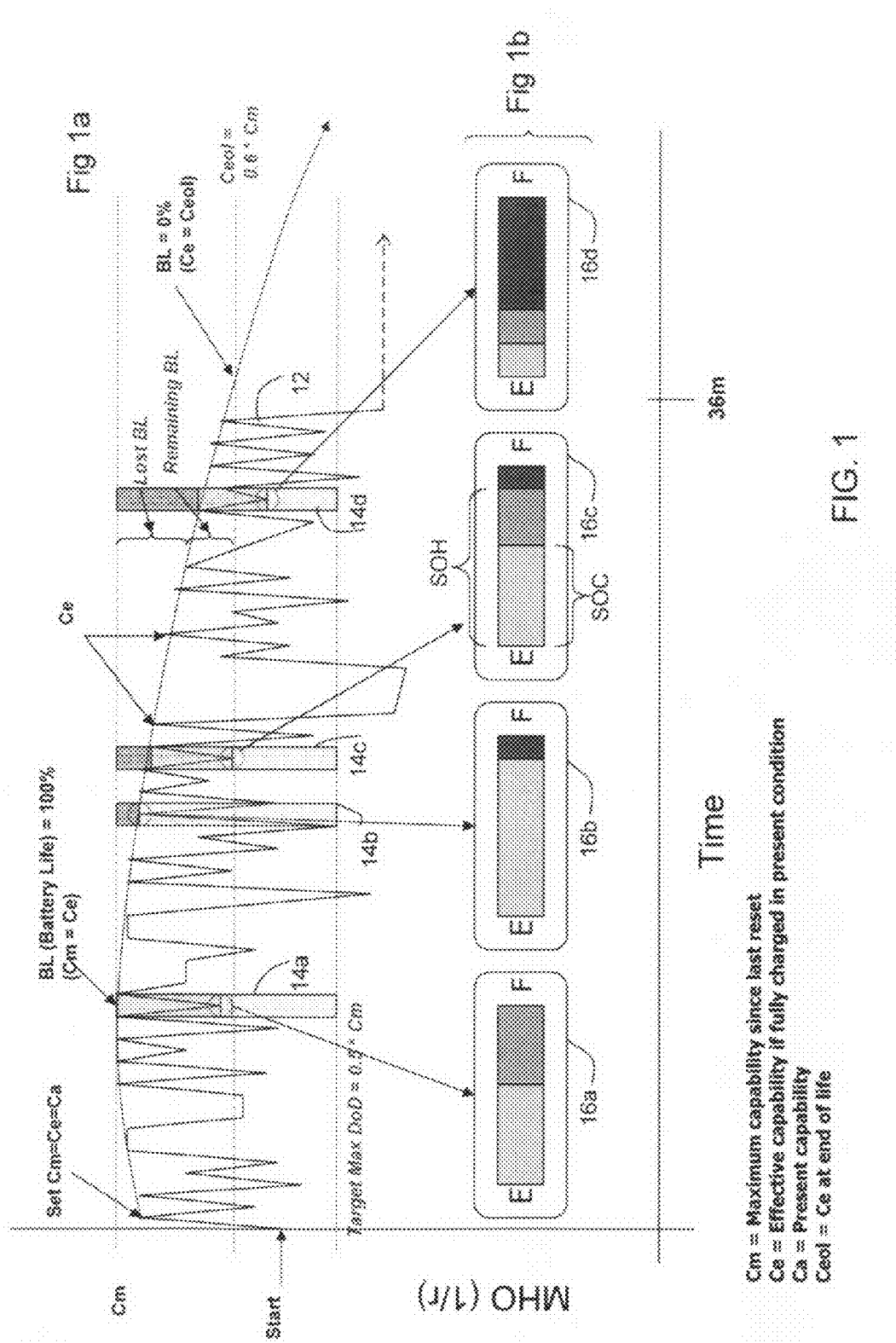
FIG. 1, comprising

The following description of the preferred embodiments of the invention essentially includes the text of provisional application Ser. No. 60/935,017, from which the present complete application claims priority, although corrections and clarifications have been made. Following this, there is a detailed discussion of further discoveries and associated improvements made subsequently. Ser. No. 60/935,017 and the Appendices with which it was filed are incorporated herein by this reference. Further, applicants reserve their right to submit additional claims to any particulars disclosed therein and not claimed as of the initial filing of this application.

Stand-Alone Engine Starting Battery Monitor

In one aspect of the invention, a stand-alone apparatus and method of monitoring an engine starting battery are provided. A monitoring device is physically secured to a battery, and is electrically connected to the battery terminals, such that the device can continuously monitor the battery for the remaining life of the battery. The device is intended to be attached in a removable way such that at the end of life of a battery, it can be removed and attached to another battery.

The device includes a testing circuit to monitor the battery during engine starting, and may implement the teachings of Huang U.S. Pat. No. 6,791,464, incorporated by reference above. The testing circuitry automatically detects the initiation of every engine starting sequence, and continuously monitors the voltage of the battery before and during every engine starting sequence. The circuitry is configured to sample the voltage at a sufficiently high rate (typically between 20 hz and 1 khz) such that the changes in voltage during an engine starting sequence are identifiable. One or more key performance parameters are identified from the continuously monitored voltage, and are compared to one or more reference values stored in a memory of the test circuit. A battery performance result is calculated as a function of the one or more key performance parameters and the one or more stored reference values. An output related to the battery performance result is provided.

For example, one key performance parameter is the lowest voltage measured during an engine start sequence. This value can be compared to a reference value and presented as a percentage value indicative of the battery's ability to start the engine. The output can be numerically or symbolically presented on a display directly attached to the monitoring device, e.g., mounted on or near the battery. The output can also be audibly communicated, for example, an audible alarm can be given when the battery performance result for an engine start is below a stored threshold limit. The output might be communicated wirelessly to a display device in the vehicle cabin. These embodiments of the invention can be readily implemented in an aftermarket product, as discussed further below. An indicator of a weak performance start can also trigger a diagnostic code to be stored for subsequent communication to a separate diagnostic assessment tool such as an on-board diagnostic code reader, as provided in all modern automobiles and certain other vehicles; typically this would require that the monitor of the invention be installed at manufacture.

In its simplest form, the test circuitry comprises one wire attached to a positive terminal of the battery, one wire attached to a negative terminal of the battery, a sampling circuit connected to the two wires that can sample the electrical parameter(s) of the battery, a microprocessor connected to the sampling circuit, and an input/output device connected to the microprocessor. The wires can be multiple conductor wires such as Kelvin connections or single conductor wires.

It is well known in the art that the sampling circuit may include analog to digital (A/D) converters necessary to convert analog data to digital data to be used by a microprocessor to perform the desired analysis. It is also well known in the art that microprocessors can be used to control the sampling circuit, analyze data from the sampling circuit, save data to memory, and communicate data through an input/output device. The input/output device can be a digital or analog display, a printer, portable memory, any physical or non-physical (wireless) data transport system, or any other device common for viewing or communicating data.

As further discussed below, the same device, or a similarly-configured and -connected device, can also include a means to apply a current to the battery, or to apply a load to the battery, in accordance with the teachings of the other Huang patents and application referred to above, to measure other aspects of the condition of the battery, or of associated deep-cycle batteries.

Starting Battery Monitor with on Board Temperature Sensor

It is well-known that battery capacity varies with temperature. To provide suitable compensation for this effect, in another embodiment of the invention, the monitoring device is further equipped with a temperature sensor. The temperature sensor can be comprised by the testing circuit mounted to the surface of the battery, or alternatively located at the terminals of wires connecting the testing circuit to the battery terminals. The temperature sensor measures ambient temperature and provides temperature information to the test circuitry. The test circuitry creates an adjusted battery performance result as a function of the temperature and the battery performance result.

Starting Battery Monitor with Failure-Predictive Functions

In another embodiment of the invention, the described monitoring device is equipped with a memory to store values for one or more key performance parameters of more than one successive engine starting sequences. The test circuitry compares key performance parameters of more than one engine starting sequence and calculates a rate of change of the one or more key performance parameters. The test circuitry determines a remaining useful life value as a function of the rate of change of the key performance parameters and one or more stored threshold values. The remaining useful life value is calculated as a number of starts remaining or as an amount of time remaining. The remaining useful life value is displayed on a display attached to the monitoring device. An example formula for such a calculation is as follows:

Rate of change of an example key parameter value (for example, the minimum voltage reached during the starting sequence):

$$\text{Delta } Sv = (Svx - Svx+n)/n, \text{ where:}$$

Sv=start performance value
Svx=start performance value for start x
Svx+n=start performance value for start x+n
n=number of starts between Svx and Svx+n This rate of change value Delta Sv can be used to predict how many starts ("N") it will take for a future start performance value to reach a stored threshold value; for example, by thus effectively monitoring the minimum value of the voltage ("Svx") during the starting sequence, one can estimate when the battery will reach the point ("Svmin") at which the battery will fail to start the engine, as follows:

$$N = (Svx+n - Svmin)/\text{Delta}Sv$$

Rather than using the number of starts N as the increment of measurement for prediction, a very similar formula can use time as the increment of measurement. In this way, the start performance value can be calculated over time and the remaining useful life of the battery can be expressed as an amount of time in the future, rather than a number of starts.

In both equations, Svx can be the start performance value of a single engine start, or it can be an average of multiple engine start values. Likewise, Svx+n can be a single engine start value, or an average of multiple engine start values. By using averages of many starts to establish a start performance value, small variations between engine start values that are not attributable to the decay in performance of the battery can be minimized, and the accuracy of the prediction can be improved.

More specifically, variations in start performance values can occur due to differences in engine temperature, battery temperature and engine lubrication. In addition to averaging start performance values over time, one method to minimize variations in start performance values is to base remaining useful life indications on the lowest start performance values recorded in a larger set of values. This is a useful and realistic method because a battery will almost always fail when conditions are difficult, for example when the battery and engine are cold and lubrication is poor, such as the first start of the day on a cold morning. The start performance value associated with such difficult start conditions is a more important predictor of overall battery condition than the start performance value associated with relatively easy conditions, such as the second start of the day, after the engine and battery have been warmed from use.

Accordingly, in one embodiment of the invention, a memory stores the worst start performance value and also the most recent start performance value, and is able to compare both of these values to a reference threshold value to determine overall battery health. In this way the device can indicate the overall battery health and the performance of the battery on the most recent start. Both values can be indicated on an analog display at the same time, providing the user with critical start performance information at a glance.

Key performance values used to determine the remaining useful life of a battery may include terminal voltage, DC internal resistance, dynamic conductance, dynamic impedance, and any other parameter that changes as the battery ages and is used.

Stand-Alone Storage Battery Capability Monitor

In another aspect of the invention, a stand-alone apparatus and method of monitoring the stored energy of a battery is provided. Although not to be so limited, this aspect of the invention is particularly useful where the battery (or batteries connected to form a battery bank) is employed for "deep-cycle" use, e.g., to supply substantially continuous loads, as opposed to the short-term loading experienced by starting batteries, as above. The device in this embodiment may be physically and electrically attached to a battery as described above, and is configured to automatically and continuously measure one or more parameters of the battery, calculate further battery parameters from the measured parameters, and provide an output indicative of battery capability. The output may include evaluation and communication (via display or otherwise, as discussed further below) of one or more of the state of health (SOH) of the battery, its state of charge (SOC), its available capability Ca, and its effective capability Ce, all as defined above. As discussed in detail below, these parameters can be communicated to an associated battery charger and used to control it so as to optimize battery charging in a way not otherwise possible.

The parameters that are thus measured or calculated may include, but are not limited to, the following: temperature, voltage, DC internal resistance, dynamic conductance, dynamic impedance, and current. By measuring or calculating these parameters consistently over time, for example once every 60 seconds, the apparatus can evaluate the performance parameters of ultimate interest to the user, such as current flow into or out of the battery, and the state of charge and state of health of the battery. In this way, for example, the capability monitor can function effectively as a 'fuel gauge' for determining the available energy in the battery at any time, whether it is being charged, discharged, or is at rest.

The circuitry and method used to measure the battery parameters are preferably those described in U.S. Pat. No. 6,704,629 or U.S. Pat. No. 7,212,006, and is most preferably that disclosed in application Ser. No. 11/984,669 filed Nov. 20, 2007, as referred to above, for measuring the internal conductance of a battery. The circuitry for determining the battery capability, i.e., SOC and SOH, may implement the novel "ABMS" battery analysis methodology described further below. If desired, devices providing these capabilities might also incorporate those of the engine starting battery monitor described above.

ABMS—Battery Capability Monitor with Memory for Automatic Learning and Predictive Ability According to another aspect of the invention, a battery capability monitor that calculates a key battery parameter from measured parameters is configured with memory and processing circuitry so that battery performance attributes can be derived from measured parameters and used to determine and predict key performance parameters. One such key battery performance parameter is battery capability, which can be derived from measurements of the DC internal resistance of the battery. More specifically, the DC internal conductance of the battery, that is, the mathematical inverse of its DC internal resistance, is a useful parameter that increases in proportion to battery capability. The terms "DC internal resistance" and "DC internal conductance" are to be considered equivalent throughout this application unless clearly stated otherwise. In addition to the preferred method of measuring the internal conductance of the battery described below, other accurate methods of measuring the battery's internal resistance or conductance can be used. Described below is one embodiment of an Automotive Battery Monitoring System ("ABMS") that provides novel battery analytical functionality; although described herein as optimized for automotive applications, it is of course not limited thereto.

More specifically, as a battery is repetitively charged and discharged over time, the DC internal conductance first increases as the capability of the new battery initially increases, and then decreases as the battery ages. The DC internal conductance also varies as the battery is discharged or charged in any particular cycle. Thus, in order to properly indicate the battery's state of health (SOH), which is indicative of its overall condition as it ages, and its state of charge (SOC), which is indicative of its instantaneous capability, that is, the amount of energy immediately available, it is necessary to differentiate between, for example, a battery that is relatively new but relatively discharged and a battery that is older but is fully charged, since both may exhibit the identical value for internal conductance. Stated differently, simply measuring the internal conductance of a battery is not sufficient to provide accurate information concerning both its SOH and SOC.

The Champlin patents referred to above (and many others of similar import) indicate that internal conductance is indicative of the SOH of a battery and that compensation for incomplete SOC can be effected by measuring the battery's open-circuit voltage and using this as indicative of its state of charge. However, this is workable only if the battery is disconnected from all sources of charge or load, i.e., if it is disconnected from the vehicle (or other load); this is a highly undesirable constraint on the device.

According to one aspect of the present invention, as the battery is repetitively discharged and recharged in ordinary service, a battery parameter indicative of its capability is determined repetitively. The maximum value reached when the battery is fully charged in each charge/discharge cycle is termed Ce, its effective capability. As noted above, the instantaneous capability of the battery, termed Ca, is indicative of the amount of energy presently available. Ce is reduced over time, as the battery ages, in a predictable, gradual fashion, so that significant departures of Ca from the fully-charged value Ce can be taken as indicative that the battery is currently partially discharged. Ca is thus an accurate indication of the amount of energy instantaneously being stored by the battery, and Ce is indicative of the amount of energy it is capable of storing at any given point in its life cycle, independent of the amount Cm it was capable of storing when new. As also noted above, the relationship of Ca to Ce is indicative of the battery's instantaneous SOC, while the relationship of Ce to Cm is indicative of its SOH. By comparing Ce/Cm to a predetermined minimum value for SOH, or, equivalently, by comparing Ce to a predetermined value, the monitor according to this aspect of the invention can be used to provide an accurate indication of the battery's reaching the end of its useful lifecycle.

Figure 3:
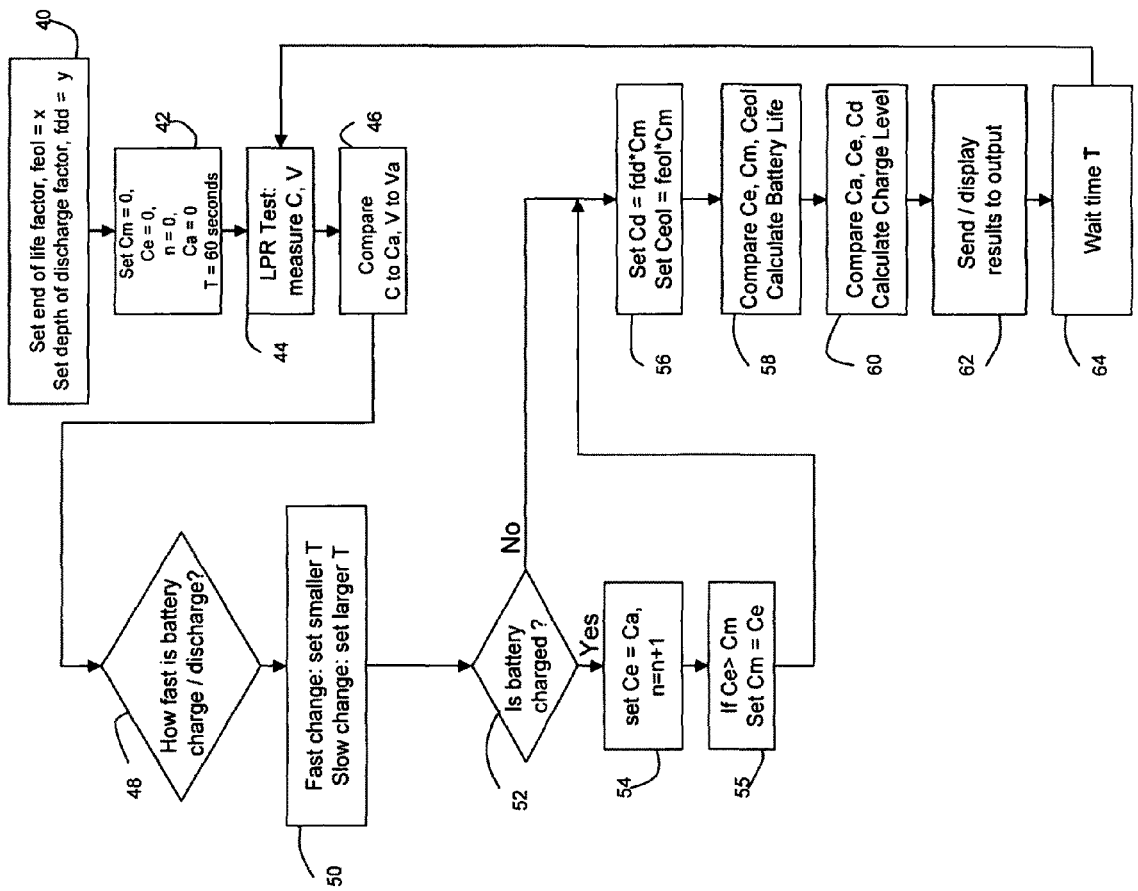
FIG. 3 shows schematically an exemplary algorithm implementing the method of the invention for evaluating the condition of a battery, illustrating the self-learning attribute of the method.

Broadly speaking, the ABMS according to this aspect of the invention operates as follows. A battery parameter, typically its DC internal conductance, is evaluated at intervals, preferably using the techniques disclosed in the Huang patents and pending application incorporated by reference above, yielding Ca. A number of measurements of Ca are stored and processed in one of several possible ways discussed below to determine Ce. The maximum value reached by Ce over the lifetime of the battery is taken as Cm and is stored. The ratios Ce/Cm and Ca/Ce can likewise be calculated at the same intervals and used to provide user information concerning SOH and SOC, which can be used appropriately to predict and thus avoid incipient battery failure. FIG. 3, discussed below, provides further details of an exemplary algorithm carrying out these functions. Information provided by the monitor of the invention can also be used to identify difficulty with ancillary equipment, e.g., an inoperative charging system, or the presence of a load at an inappropriate point in the vehicle's operating cycle, indicating a short circuit or the like, and can also be used to optimize battery charging.

The fact that the device of the invention operates by storing the maximum value of Ce that is reached as Cm, as indicated, has an inherent advantage, as follows. New batteries are generally provided nominally "fully-charged", so that they can be used immediately, but those of skill in the art will recognize that in fact a new battery connected in, e.g., a properly functioning automotive environment will become more fully charged during initial use. Thus, for example, as a new battery is charged to its full state, its DC internal conductance when fully-charged will increase gradually. Cm as recorded will thus rise over the first few charge/discharge cycles, as the new battery reaches its truly fully-charged state. Thus, a monitor according to the invention can 'learn the size' of a battery over time (generally more than one charge-discharge cycle) and need not be pre-programmed with any reference value. Accordingly, the monitoring device of the invention can be flexibly be used to accurately monitor any size of battery, and can be moved from battery to battery without needing to be re-programmed.

FIG. 1 illustrates the operation of the ABMS monitor of the invention. In FIG. 1(A), Ca, as determined from the DC internal conductance of the battery (as indicated, measured in units of mho's, the inverse of ohms, in which resistance is measured) is graphed versus time (36 months in the exemplary Figure) by line 12. The jagged shape of line 12 illustrates the manner in which Ca varies as the battery experiences charge/discharge cycles; four exemplary points in time 14a-14d are denominated by boxes. The cycles 14a-14d correspond to four illustrations of a "battery gauge", indicated at 16a-16d of FIG. 1(B), and discussed further below.

As illustrated, the available capability Ca of the battery varies substantially over each charge/discharge cycle. However, as discussed above, the maximum value of Ca reached in each cycle, that is, Ce, increases over the first few cycles as a new battery is fully charged in initial use, reaching a maximum capacity value termed Cm, and thereafter decreases over time as the battery ages. A line may be drawn connecting the maxima in line 12; at any given moment, the value represented by this line, which is termed the "effective capacity" Ce of the battery, can be compared to the measured value Ca thereof. As indicated, the degree to which the measured value Ca approaches Ce—typically expressed by the ratio Ca/Ce, as noted—is indicative of the state of charge (SOC) of the battery and thus of the relative amount of energy remaining. The degree to which Ce approaches Cm, the maximum value reached over the lifetime of the battery, typically expressed by the ratio Ce/Cm, as noted, is indicative of the SOH of the battery. Both SOC and SOH can be clearly displayed to a user on a single "fuel gauge" type display, as exemplified at 16a-16d of FIG. 1(B).

More specifically, a single fuel gauge can show SOC and SOH by providing a bar-graph with three segments, typically colored differently for clarity. SOC is determined by comparing Ca to Ce, as indicated in the graph of FIG. 1(A), showing variation of Ca over time; SOH is determined by comparison of Ce to Cm and to a predetermined value of Ceol, considered the battery's Ce at end-of-life. In the example illustrated by FIG. 1(A), Ceol is set to 0.6 Cm. In the exemplary embodiment illustrated by 16a-16d of FIG. 1(B), the current SOC is illustrated by the left segment of the fuel gauge, SOH is represented by the sum of the left and central segments, while the right segment represents the amount of battery capability lost (termed "Lost BL" in FIG. 1(A)) over time. Given that it is desired that the fuel gauge read "empty" at the end of battery life, the fuel gauge is controlled so that the right segment fills the gauge when Ce=Ceol=0.6 Cm, as indicated. As illustrated in the four shaded areas of FIG. 1(A), the relative position of Ce between Ceol and Cm determines the extent of battery life lost at the various stages in the battery's lifecycle.

Thus, as shown at 16a of FIG. 1(B), where Ce=Cm, but the battery is relatively discharged, the left segment of the fuel gauge shows that SOC is on the order of 50%, but SOH is 100%; there is no right segment in the fuel gauge, as Lost BL=0%. As the battery ages, the right segment grows. At 16b, taken at a point where Ca=Ce, that is, where the battery is fully charged, the left segment indicating SOC occupies all of the fuel gauge except that occupied by the right segment, which represents the degree of Lost BL at that point. Likewise, in FIG. 16c, the SOC is shown as substantially less than SOH, indicating that the battery is substantially discharged. However, the right segment is still comparatively small, indicating that SOH is high and the battery is overall in good condition. Finally, in FIG. 16d, the right segment of the gauge occupies most of its area, indicating that SOH is low, that is, most of the battery life has been lost.

FIG. 1(A) also shows that a "discharge warning threshold" value may be predetermined as a fraction of Cm, somewhat above a Target Max(imum) Depth of Discharge (DoD) value (below which the battery may be damaged) to which Ca is compared; this comparison can be used to provide the user with a warning that the battery is becoming significantly discharged, such that corrective action is called for.

It will be appreciated that in order to operate as above it is important that the battery's effective capability Ce be accurately determined. This is not a simple matter. Firstly, the internal conductance value as measured will typically vary over a small range, even when the battery is fully-charged. Thus, simply determining the inflection point where the rate of change of Ca goes from positive (during charging) to negative (during discharge) is unlikely to yield suitably accurate results. Statistical analysis to reduce this "scatter" might render this approach sufficiently robust for effective use. Another possibility is to measure the voltage across the battery as a function of time and take Ca as Ce when the voltage does not vary over more than a predetermined value (say 0.1 v) over a predetermined period of time (say one hour). When these conditions obtain during charging the battery can be taken to be fully charged, such that Ce can be equated to Ca.

Discussing the ABMS technology in more general terms, as above, as a battery ages over many charge—discharge cycles it naturally loses capability. In addition to storing the maximum capability value (that is, of the new battery), the monitor according to the invention can also store the largest capability value associated with a full charge of the battery as its capability varies over time. This value is called the effective capability of the battery. When the battery is new, the effective capability value is similar to the maximum capability value. However, over many charge/discharge cycles, and with the passage of time, the effective capability value will decrease as the battery naturally ages and through sulfation, corrosion, or other battery decay processes, slowly loses the ability to store energy. The monitor according to the invention can compare the effective capability value determined after a recent charge cycle to the stored maximum capability value. This comparison can be used to determine the amount of capability the battery has lost since it was new. This comparison can be expressed as a percentage and indicates where the battery is in its life cycle. This comparison is related to battery life or state of health. The rate of change of the battery life cycle value can be used to understand how long it will take for the battery to reach end of life, and how much useful life remains.

For example:

$$\text{Delta } Ce = (Cex - Cex + t)/t$$

Where:
Delta Ce=rate of change of effective capability
Cex=effective capability value determined at time x
Cex+t=effective capability value determined at time x+t
t=time between measurement of Cex and of Cex+t Determining the rate of change Delta Ce between any pair of points at which Ce is determined amounts to calculating the slope of a segment of the line shown smoothly connecting these points in FIG. 1(A). Given that slope of this line will change only very gradually, thus determining the line segmentally will be perfectly adequate for the purposes mentioned, principally determining when Ce=Ceol. That is, the rate of change value Delta Ce can be used to predict how long it will be before the effective capability value Ce reaches a stored threshold value Ceol, which can be expressed as a percentage of a maximum or 'as new' capability value (Cm). For example:

$$T = (Cex + t - Ceol)/\text{Delta } Ce$$

T=time to end of life.
Ceol=capability at end of battery life.

Ceol can be expressed as a function of the original Ah value of the battery, that is, the value specified for the capacity of the battery when new, or as a fraction of a determined value Cm, as above. For example, Ceol may be defined as equal to, say, 0.6 Cm; accordingly, when the monitor of the invention determines that effective battery capability Ce has dropped to 60% of the stored maximum capability value Cm, the operator may be advised to replace the battery. The rate of change of the effective capability of the battery can be determined as a function of time as described above, or as a function of the total number of charge/discharge cycles. Accordingly, the result can be expressed in a projected cycle life, i.e. the projected number of cycles until the battery reaches the threshold value.

In these equations, Cex can be the effective capability value of a single capability test, or it can be an average of multiple tests over multiple charge/discharge cycles. Likewise, Cex+t can be a single effective capability value, or an average of multiple effective capability values. By using averages of many effective capability values to establish the rate of change of effective capability, small variations in effective capability not attributable to normal decay in performance of the battery can be minimized, and the accuracy of the time to end of life prediction can be improved.

A device and method as described above can be connected to a battery of nearly any size and by consistently applying a proactive test can over time learn the size attributes of the battery and at any time can simultaneously indicate the charge level or SOC and its state of health SOH, indicative of projected battery life. Such a device can be used to monitor the charge level and battery life of batteries used in many different applications. Importantly, this test technique can be applied while the battery is in use, providing real time information that has not been available using previous test methods.

Figure 2:
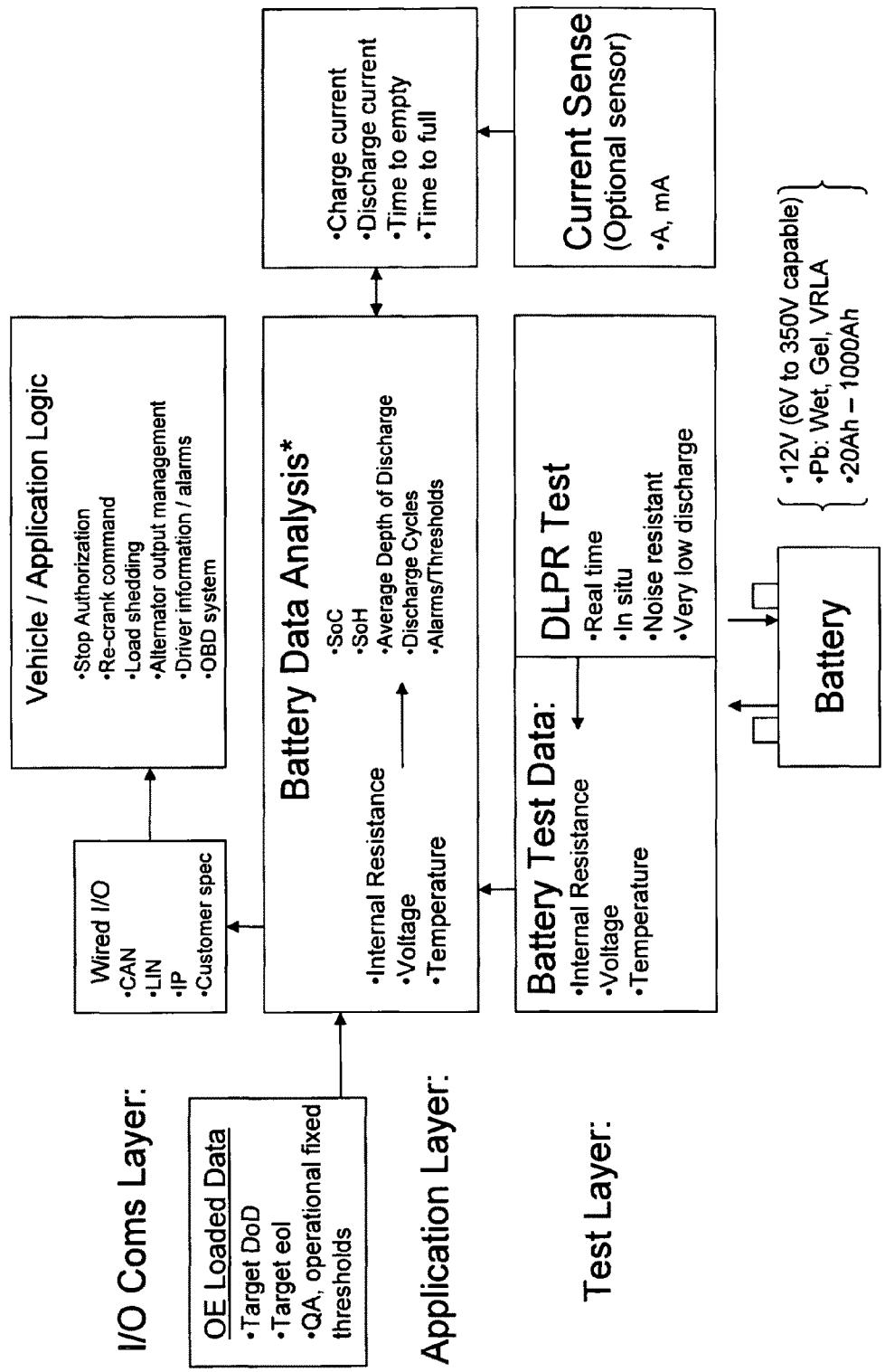
FIG. 2 shows schematically one possible implementation of a battery management system according to the invention in an exemplary automotive environment.

FIG. 2 shows further details of one possible implementation of the ABMS in an automotive environment. Interaction with the battery is carried out by a "test layer", wherein testing, preferably according to the Haung patents and application (referred to herein as the "LPR" or "DLPR" test) is performed, resulting in battery test data, including the internal resistance (or conductance, these being mathematically inverse, as noted). These data are then transmitted to an "Application Layer", wherein battery data analysis is performed, as above. As indicated, the results of this analysis include determination of the several relevant measures of the battery capabilities, Ca, Ce, and Cm; from these SOC and SOH can be determined. The battery's average depth of discharge can also be determined, which is relevant in control of key-off loads; the number of discharge cycles can readily be tracked, and various alarms can be given by comparing Ca to various thresholds, as discussed above. Finally, the results from the Application Layer can be transmitted to an I/O Coms (i.e., Communications) layer, wherein the determined data can be used in performance of various functions. For example, data concerning the battery's SOH can be transmitted to the vehicle's on-board diagnostic (OBD) system, and used to provide a "replace battery" signal when appropriate. As indicated at "External Com.", these data can also be transmitted to a remote receiver as necessary; for example, in a fleet vehicle context, the SOC and SOH data might be transmitted to a central maintenance location, so as to permit proactive battery (or alternator) service, thus avoiding battery failure and costly downtime. Other aspects and advantages provided using the novel information provided by the invention will be apparent to those of skill in the art.

As also noted on this sheet, data analysis can be performed by an "ABMS module", typically a microprocessor-driven device implementing the calculations and control methods described above, or by the vehicle's "central processor/ECU (electronic control unit)". In either case, implementation of the invention is well within the skill of the art, given the disclosure herein.

FIG. 3 provides a schematic showing of an exemplary algorithm for such analysis, specifically for determining Ca on a regular basis, comparing it to Ce, determining Cm, and using these to provide an indication of anticipated battery life and instantaneous charge level, that is, effectively implementing the "fuel gauge" of FIG. 1(b). Thus, in an initial step 40, a value x for an end of life factor feol, and a value y for an depth of discharge factor dd are assigned. These values control respectively the point at which the battery is deemed to be at the end of its useful life and the maximum depth to which it can be discharged without permanent damage. A typical value for feol would be 0.6, as in the example above, and for dd 0.5.

In the next step 42, the values for maximum capability Cm, the effective capability Ce, the available capability Ca, and a value n are initialized to zero, and T, a parameter controlling the frequency of measurement, is initially set to 60 seconds.

In the next step 44, testing, preferably according to the Huang patents and application referred to above is performed, yielding instantaneous values for the conductance C and voltage V of the battery.

In the next step 46, the instantaneous values C and V are compared to comparable values stored with respect to recently-performed similar measurements. As indicated in the next step 48, this comparison permits determination of the rate of charging or discharging, which has several implications. If the battery is discharging very slowly, this can be taken to indicate that it is not being used, e.g., if in a vehicle, that the vehicle is parked. It would be undesirable to perform testing too often under these circumstances, as the test itself draws some energy from the battery and could cause it to become fully discharged if performed too often. If the battery is being charged or is discharging rapidly, that is an indication that more frequent monitoring is in order. Accordingly, at step 50 T is adjusted accordingly.

At step 52, the determination is made as to whether the battery is charged. This can be done in any of several ways. For example, Ca, the available capability, can be compared to Ce, the effective capability; if Ca is within, for example, 2% of Ce, the battery can be taken to be fully charged. Alternatively, the battery can be taken to be fully charged if the rate of charge, determined in step 48, is less than a predetermined value. If the battery is thus determined to be charged, at step 54 Ce is set equal to Ca, a counter recording the number of charge/discharge cycles is incremented at step 54 by adding 1 to the value of n; thus recording the number of charge/discharge cycles may be useful in predicting battery life. In order to avoid excessively frequent initiation of charging cycles, the determination that the battery is charged may be implemented such that charging is only performed when the battery is discharged to a predetermined level. At step 55, if Cm, the maximum capability, is less than Ce, Cm is set equal to Ce (as will typically occur as a new battery becomes fully-charged in initial use, as discussed above); in this way, the monitor of the invention "learns" the battery's maximum capability Cm over time.

At step 56, Cd, representative of the minimum value to which the battery's capability is to be allowed to fall without damage, is set equal to fdd*Cm, thus relating Cd to the maximum capability of the battery. Ceol is similarly set to feol*Cm, allowing prediction of the battery's end-of-life based on Cm. At step 58, Ce, Cm and Ceol can be compared in order to determine SOH, e.g., as Ce/Cm, and to estimate the remaining battery life, as Ceol/Ce. At step 60, SOC can be determined as Ca/Ce, and Ca can be compared to Cd to ensure that the battery is not in danger of becoming unduly deeply discharged.

At step 62, the results of these steps can be communicated and used in any of a wide variety of ways. The results can be communicated to a user (e.g., by way of the fuel gauge described above, or by display of values for SOC and SOH on a computer screen implementing an instrument panel), provided to a vehicle status monitoring circuit (e.g., to cause a charging cycle to be initiated, or to indicate the desirability of maintenance), or transmitted to a remote monitoring location (e.g., in the fleet vehicle context, providing a status indication to a maintenance supervisory computer to schedule service). Finally, at step 64, after expiration of time T, the process is begun again.

Integrated Battery Monitor and Charge Control

The fact that the ABMS monitor according to the invention provides accurate, real-time SOC and SOH data can be used according to a further aspect of the invention to provide improved charge control, which can be expected to yield improved battery life and substantial economy. At present, in the typical practice of charging deep-cycle batteries, even so-called "smart" battery chargers simply monitor the voltage across their terminals and use this to control the rate of charge, so that it is reduced as the battery appears from this crude criterion to be approaching full charge. Clearly much more sophisticated control could be provided if a suitably programmed charger were provided with accurate SOC and SOH data. Given that it is known that over- or under-charging batteries decreases their useful life, it is self-evident that control of charging responsive to accurate measurements of these critical battery parameters can be expected to yield longer battery life.

More specifically, battery charging is inherently non-optimized according to present practices because the charger only "knows" the generic battery type (e.g., traditional "wet cell", absorbed glass-mat ("AGM"), or valve-regulated lead acid ("VRLA"), or gel-cell), this information ordinarily being provided by the user upon charger installation. (Even according to the invention as now envisioned the user will still need to do so.) However, today's battery chargers (even the "smart" or "three stage" chargers now available) are not provided with information concerning the capacity of the battery, nor how rapidly it can absorb and deliver energy. If the charger were able to adjust its output (current and voltage) based on the size of the battery, the charging rate could be increased where appropriate, while avoiding overcharge. Accordingly, charging would be faster and safer.

If a battery charger with charge rate control were provided with input from the ABMS battery monitor of the invention, such that the charger would "learn" the effective capacity (Ce) of the battery (and the maximum capacity Cm), the charger could then scale the output (current and voltage) to match the size and state of charge of the battery. For example, a charger capable of delivering current at a maximum of 10 A might be operated at 3 A to optimally and safely charge a small battery. Additionally, information as to the SOC of the battery, as compared to the effective capacity Ce, could be employed to manage the state transitions of the charger. More specifically, typical 'smart' chargers have a "Bulk charge" phase (constant current), an "Absorbtion charge" phase (constant voltage) and a "Float charge" phase (lower constant voltage.) The transitions are managed by monitoring voltage and current respectively. However, the current threshold used to manage the second transition is only appropriate for a battery of a specific size. By use of the ABMS technology, the charger would be able to detect the size and set the transition more appropriately for the size of the battery.

Another benefit would be provided as the battery ages. As discussed above, the ABMS technology can detect that a battery is losing effective capacity and at some threshold or other trigger could control the charger to begin a desulfation process or an equalization process. (At present, these steps are to be initiated and controlled manually by the user; doubtless many users do not do so at the optimal times, if at all.) Present-day battery chargers, to which the only input parameters are voltage and current, have no information concerning the capability of the battery or the manner in which it is changing, and so cannot automatically manage this process.

Furthermore, the ABMS technology can do more than simply control the charge rate. If the technology is integrated, as it would typically be in a charger/inverter application, it can also tell the charger when to turn on and off based on actual charge level, rather than on voltage, which is often varying because of the attached load. For example, use of the ABMS technology would enable control of a generator so as to activate it when the batteries are actually discharged, rather than simply in response to detection of a low voltage, which might occur while fully-charged batteries are supplying a large momentary load.

Figure 4:
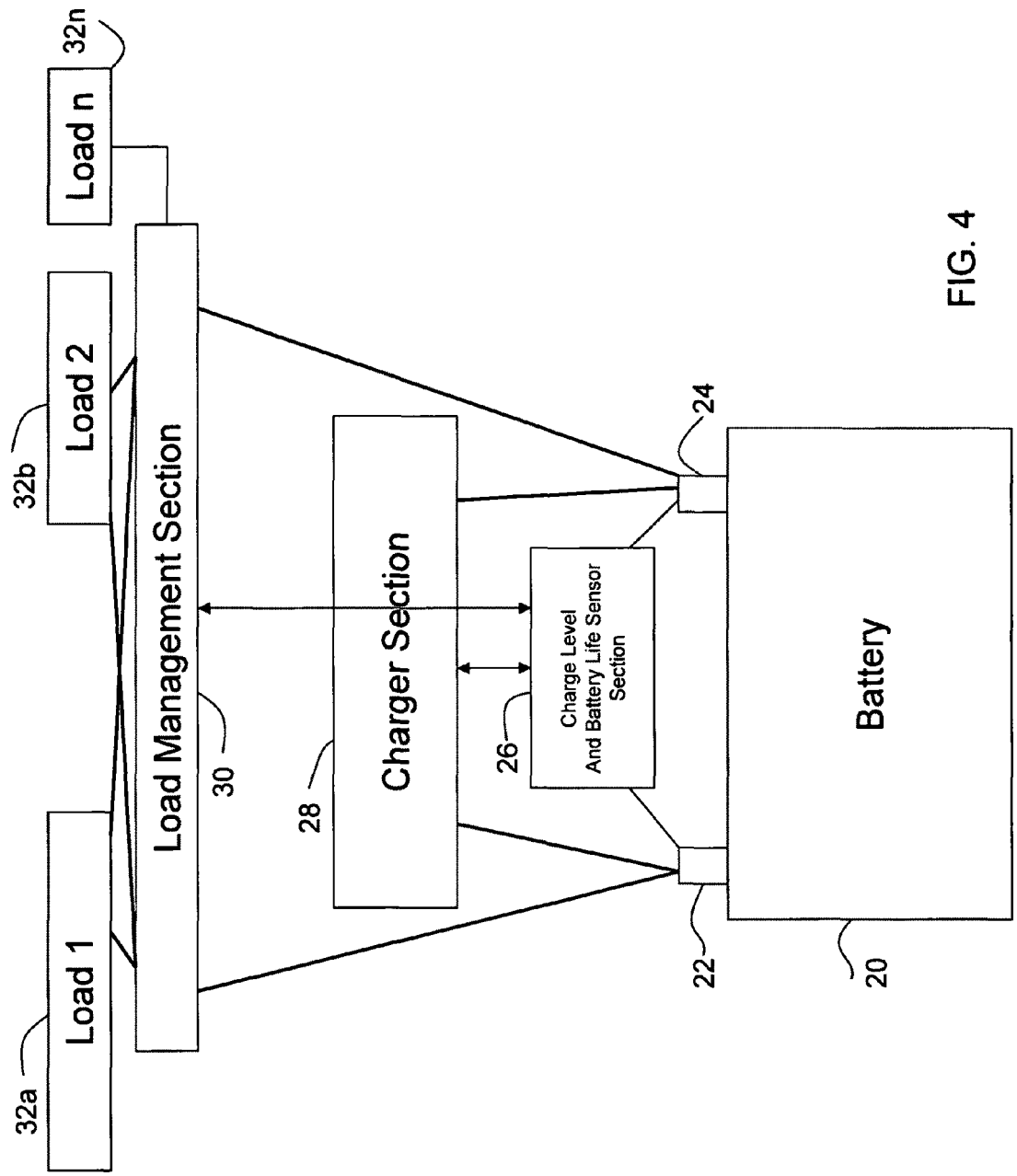
FIG. 4 shows a block diagram of an integrated battery monitor and charging system.

FIG. 4 shows a schematic block diagram of a typical system where a deep-cycle battery (or bank of discrete batteries) is used to supply one or more loads, incorporating a battery monitoring and control system according to this aspect of the invention. The paths of power distribution are shown by heavy lines, and signal measurement and control lines by lighter lines. The battery is shown at 20. Connected across its terminals 22, 24 are a charge level and battery life sensor section 26, a charger section 28, and a load management section 30. Load management section supplies power to the various loads 32a, 32b, ... 32n. The charge level and battery life sensor section 26 monitors the battery. Preferably using the techniques disclosed in the Haung patents and application referred above, charge level and battery life sensor section 26 determines the internal conductance of the battery 20 on a regular basis, and implements the ABMS technology disclosed above to use this information to determine the key parameters, e.g., Cm, Ce, and Ca, and from these SOH and SOC, for the battery 20.

The battery parameters thus determined by charge level and battery life sensor section 26 are communicated to, and used to control operation of, charger section 28. Charger section 26 may comprise several sources of charge. For example, on a boat, charge may be obtained from an alternator on the propulsion engine(s), from a separate engine/generator "genset" unit, from a shore-powered battery charger, solar panels, a wind-driven generator, and the like. Depending on the needs of the battery, and the operational condition of the boat (for example, whether it is tied up at a dock and connected to shore power, motoring under its propulsion engine(s), or anchored) different sources of charge may be activated. For example, where the boat is anchored overnight, drawing power from battery 20 to supply various loads 32a, 32b, ... 32n via load management section 30, charger section 26 may comprise control circuitry to activate a genset responsive to detection that the battery SOC is dropping close to a preset value.

As indicated, a control line may be provided directly from charge level and battery life section 26 to load management section 30; this might be used to control disabling of one or more loads 32a, 32b, ... 32n, e.g., in the event battery SOC is below a threshold and is not being resupplied through some flaw in charger section 28, in order to prevent excessively deep discharge of battery 20, which can cause permanent damage.

It is thus envisioned that the information provided by charge level and battery life section 26 indicative of battery SOC and SOH could be employed in all aspects of control of a complex DC power distribution and battery charging system.

Given the disclosure above and the information in the Huang patents and application, implementation of this aspect of the invention is within the skill of the art.

Capability Monitor with Automatic Sample Rate Scaling

In another aspect of the invention, the ABMS monitor as described above automatically adjusts the sampling rate of measuring the battery parameters. Operating a test circuit and actively testing for battery parameters on a consistent periodic basis (for example once every 60 seconds) can consume a significant amount of power over a long period of time (for example 90 days.) For some battery applications, for example, in automotive use, the efficiency of accessory circuits such as a battery monitoring circuit is very important and their power consumption must be carefully managed in order that the monitoring circuit does not itself drain the vehicle battery over time.

To reduce power consumption of a battery monitoring circuit such as those disclosed in the Haung patents and application, and the ABMS monitor described herein, a microprocessor comprised by the monitor of the invention compares one set of calculated key performance parameters to another set sampled at a different time, and determines whether the key performance parameters are changing rapidly or slowly. If the change is rapid, indicating that the battery is experiencing repetitive charge/discharge cycles as the vehicle is used, the microprocessor will increase the sampling rate, for example, performing the test once every 10 seconds or once every second. This is exemplified at steps 48 and 50 of FIG. 3. If the change is slow, indicating that the battery is not being used, the microprocessor will decrease the sampling rate, to perhaps once every hour or once every week. In this way, the monitoring circuit can adjust its performance to optimize accuracy of results, while minimizing power consumption.

In one preferred embodiment of such a battery monitor, the parameter measured is simply voltage; in another embodiment, the parameter measured is DC internal conductance. The parameters considered by the microprocessor to establish the test frequency could be a combination of these or any other parameters such as dynamic conductance or dynamic resistance. Alternatively, the test frequency can be set by an input from an external source such as a command from a wired or wirelessly connected network, for example a LIN, CANBUS, or IP network.

In a preferred embodiment, the test circuitry can be physically attached to the vehicle's battery wiring harness, such that the electrical connections of the battery sensor device are embedded in the battery terminal clamps. The benefit of this approach is that in this way employment of the sensor of the invention does not create any additional and separate connections that must be managed by the vehicle assembly factory or after-sales service technicians. A battery can simply be replaced in the vehicle without any need to specifically connect or disconnect the sensor.

When the battery sensor device is used in automotive applications as described above the self-learning attributes of the sensor device are very useful. Nonetheless, the device can provide additional benefits if some minimum threshold values are provided. These additional minimum threshold values could include a value such as a minimum DC internal conductance value, such that a defective battery, or a battery improperly sized for the application, would be identified very quickly, at the factory or just after the battery is installed. Assuming that the monitoring device of the invention were provided as part of the vehicle, as delivered, such minimum threshold values could be provided by the vehicle's on board computer system, or could be permanently stored in the sensor device memory. If the monitoring device of the invention were provided as an aftermarket accessory a nominal value for the battery's capability could be input by the user at installation, in any of a variety of ways known to those of skill in the art.

Other attributes that could be stored in memory of the monitoring device of the invention are the number of battery charge/discharge cycles and the average depth of discharge as well as any other battery attribute that might be determined from one or a combination of the measured parameters.

Any of the above mentioned embodiments may be used in conjunction with traditional battery sensor technologies, such as current sensors, which may be implemented using shunts or Hall-effect coils, both well-known to the art. By combining the relative charge information from the above embodiments with current flow information from a current sensor, the monitoring devices of the invention can be used to establish very precise "time to empty" and "time to full charge" information, which may be of value to the user.

The embodiments described herein generally refer to integrated monitoring devices having memory and calculation circuitry capable of processing raw data (voltage, temperature, time) in order to determine intermediate parameter(s) (DC internal resistance) and then compare this to stored data to determine summary information, the parameters of direct value to the user (battery capability, charge level, life cycle status, time to full or time to empty). It is also within the scope of the invention to provide effective communication between the sensors and an external information system, such that raw data (voltage, temperature, time) or the intermediate parameter(s) (DC internal resistance, or summary information) can be sent from the sensor device to a remote information system such as a vehicle central computer, or other processing unit remote from the sensor device. In the latter embodiment, the memory storing threshold and historical values, and the microprocessor performing calculations and implementing algorithms that convert the raw battery data into summary information such as charge levels, battery life, state of health, etc., are part of the remote system. In an automobile, for example, the battery sensor can send summary information to the vehicle information system, or the battery sensor can send raw data to the vehicle information system and the vehicle information system can process the raw data into appropriate summary information.

In either case, the summary information indicative of battery performance and capability can be used to control important vehicle systems. For example, it is common for vehicle batteries to become discharged if used to supply accessory loads (stereo, air conditioning) while the engine is shut off, possibly preventing restart of the engine. According to the invention, the monitoring circuitry can be integrated with the vehicle's starting circuitry to restart the main engine (or an auxiliary generator, if provided) so as to recharge the battery if the charge level reaches a predetermined threshold, or to shut down specific battery loads if the battery charge level becomes too low. Similarly, if the battery state of health or battery life decreases to a predetermined threshold, a flag can be set in the vehicle diagnostic system informing the operator or a service technician.

Remote Display of Battery Monitor Data

To solve the previously described problem of inconvenient location of a battery compared to the location of a user or system making use of battery information, it is useful to provide the battery monitor device with the capability of periodically or continuously sending data to a remote display or information system. Any of the previously described embodiments can output measured and calculated information to a separate display device or information system that is remote from the test circuitry of the monitoring system. Any analog or digital communication technology may be used to convey the information to a remote display or system. Such known communication technologies may be implemented using wired or non-wired connections; the latter may include radio communications, infra-red, or other technologies. The communication protocol may comprise any known or later-developed unidirectional or bidirectional analog, digital, serial or packet based communications protocol, including, but not limited to RS232, IP, TCP/IP, GPRS, USB, CAN, SNMP, LIN, WiFi, Zigbee, and others. The remote display or information system may also use the communication system to send a data request or command to the test circuitry of the battery monitor device, or to set or re-set a stored reference value or threshold value in the monitor device.

Remote Display of Information and Specific Battery Monitoring Networks

Another embodiment of the invention addresses the needs of applications with more than one battery; for example a boat, recreational vehicle, or military vehicle will typically have an engine-starting battery and one or more bank(s) of deep-cycle batteries. To provide complete monitoring capability, each battery (or separately-connected battery bank) in the system is fitted with an appropriate battery monitoring device of the appropriate type described above. Each monitoring device monitors the corresponding battery as described above and uses a uni- or bi-directional communications link to communicate battery test data to one or more remote displays or information systems. Together the monitoring devices and displays of the system define a single specific battery monitoring network. The one or more monitoring devices and one or more displays of a network are configured to share information exclusively with monitor devices and remote displays in their specific network, such that many specific battery monitoring networks can operate in close proximity, without sharing data between or interfering with one another. In a specific battery monitoring network, each of the remote displays or information systems may be operated by a user to retrieve data from any one of the monitoring devices. Such a system may be used for example in a boat, recreational vehicle, or military vehicle application where multiple batteries, each used for different applications, can all be individually monitored each by a dedicated monitoring device, and the resulting data and critical battery information from each of many batteries may be displayed on a single display, or user interface conveniently located to the operator.

Flexible, Extensible, Specific Battery Monitoring Networks

Another embodiment of the invention comprises a specific battery monitoring network comprised of one or more battery monitoring devices and one more remote displays configured such that monitoring devices and displays may be flexibly added or removed from the specific battery monitoring network, thus creating an extensible specific battery monitoring system. An extensible network is useful where there are multiple batteries in a single system, or multiple systems each with a single battery whereby batteries or systems are entered into or removed from service on an ad hoc basis. Examples include a fleet of electric fork trucks used in a warehouse, or a boat with multiple banks of batteries. In both situations, batteries may be added to or removed from the network and the monitoring system reprogrammed to accommodate the alteration.

Fixed Base Specific Battery Monitoring Networks

Another embodiment of the invention is a specific battery monitoring network comprised of monitoring devices installed on one or more mobile vehicles, such as material handling equipment operating in a warehouse facility, or on a fleet of delivery or service trucks. Each of the monitoring devices communicates, e.g., battery condition data to a centralized information system remote from the vehicles. The information system is generally a stationary system for the continuous or intermittent collection of data from the monitoring devices, so that a fleet supervisor can determine when individual vehicle batteries need replacement. In some circumstances, the battery monitoring devices may communicate substantially continuously with the remote information system; for example, in a warehouse, all vehicles with battery monitoring devices can send data continuously to the fixed position receiving station. Alternatively, the battery monitoring devices may accumulate and store monitoring data in their own memory and communicate all or a portion of the data to the information system periodically; for example, when a mobile vehicle with a monitoring device arrives back at its base at the end of the work day, the monitoring device can be interrogated and caused to download the data stored during the work day. An example of such an application is a fleet of delivery vehicles each having battery monitoring systems that will communicate their data wirelessly as they return to their depot and come into communication range with the fixed position information system. Again, such a system would be highly useful in identifying batteries in need of replacement, thus avoiding loss of time due to vehicle breakdowns.

In a further alternative, the data from the on-vehicle monitors can be communicated to a remote location, by way of the Internet or other known technique, so that the service decisions can be implemented other than at the specific location of the vehicles.

Transmission of Battery Condition and Other Vehicle Data

In still another preferred embodiment of the battery monitoring system described above, the data provided by the battery monitoring device installed in a vehicle can be combined and transmitted together with other diagnostic information concerning the vehicle. For example, essentially all vehicles are now provided with onboard diagnostic (OBD) capability, whereby diagnostic codes from the vehicle management system are stored. A service technician can then download operational status of the vehicle by accessing the system via an OBD port. According to this aspect of the invention, the battery monitoring devices described above can be enabled to store the OBD and battery condition information and transmit it to a remote location as desired, e.g., when the device is within range of the fixed position information system. Thus the battery performance information as described earlier and also any diagnostic codes that were provided on the on-board diagnostic system can readily be transmitted.

In this way the maintenance managers of a fleet of vehicles can be automatically and proactively apprised of important battery condition and vehicle diagnostic information. Given that impending failures can be often be avoided if important information is timely presented, this represents a real advance in vehicle maintenance. More specifically, the information provided according to this aspect of the invention to fleet maintenance managers and like personnel is helpful because often the vehicles are not proactively inspected for diagnostic codes or battery problems. To benefit the managers of a large scale operation, the fixed position information system, which retrieves the information from the vehicles, can be connected to the Internet and thereby update a remote computer database with important diagnostic information from every vehicle in a large fleet every time the vehicle enters the communication range of the fixed position information system. The database can be configured to maintain a history of vehicle diagnostic information and to provide periodic reports and proactive critical alerts to maintenance managers, helping fleet managers focus precious resources on to maintenance managers, helping fleet managers focus precious resources on to problems that otherwise would not have been discovered until a critical failure occurs.

Additional Disclosure Provided by the Complete Application

As noted above, this complete application claims priority from provisional application Ser. No. 60/935,017 filed Jul. 23, 2007. The following refers to subsequent discoveries and further developments.

As indicated above, the conductance C of a circuit element is mathematically the inverse of its resistance R, i.e., $C=1/R$; resistance is measured in ohms and conductance in mhos. For various reasons it is sometimes more convenient to perform the calculations involved in evaluation of a battery according to the invention using values in mhos of conductance than in values in ohms of resistance, and that is the case in connection with the preferred embodiment of the invention discussed herein. More specifically, the internal resistance IR of a battery (e.g., one installed in an automobile) is expressed in ohms. However, the internal resistance IR of the battery is very small. Thus, in order to explain the invention more clearly, the inverse of the internal resistance (i.e., $1/IR$), expressed in mhos, is used in attached figures and the following discussion. However, unless otherwise specified, resistance is considered equivalent to conductance.

More particularly, in the above discussion of the ABMS operating according to FIG. 1, several values pertaining to the "capability" of the battery were employed, that is, Cm, the maximum capability of the battery, Ce, the effective capability of the battery, and Ca, the present capability; SOC was noted to be equivalent to Ca/Ce, and SOH to be indicated by Ce/Cm. The conductance of the battery is directly indicative of its capability; the higher the value of the conductance, the more energy is stored. The self-learning capability of the ABMS system as disclosed above is very useful, but the SOH value provided will be accurate only if the monitor is connected to the battery when new, in order that the value for Cm as recorded will be truly indicative of the battery's maximum capability over its lifetime. However, it has been recently been discovered that the conductance of a fully-charged battery varies somewhat depending on whether charge is being applied at the time of measurement, and moreover that the difference therebetween is indicative of its SOH. Accordingly, a device according of this aspect of the invention can be connected to a battery of unknown age or nominal capacity and used to predict its SOH. Moreover, according to a further recent development, given that the battery is known to be fully charged, the actual flow of charge into and out of the battery can subsequently be monitored and used to track SOC over time.

Figure 5:
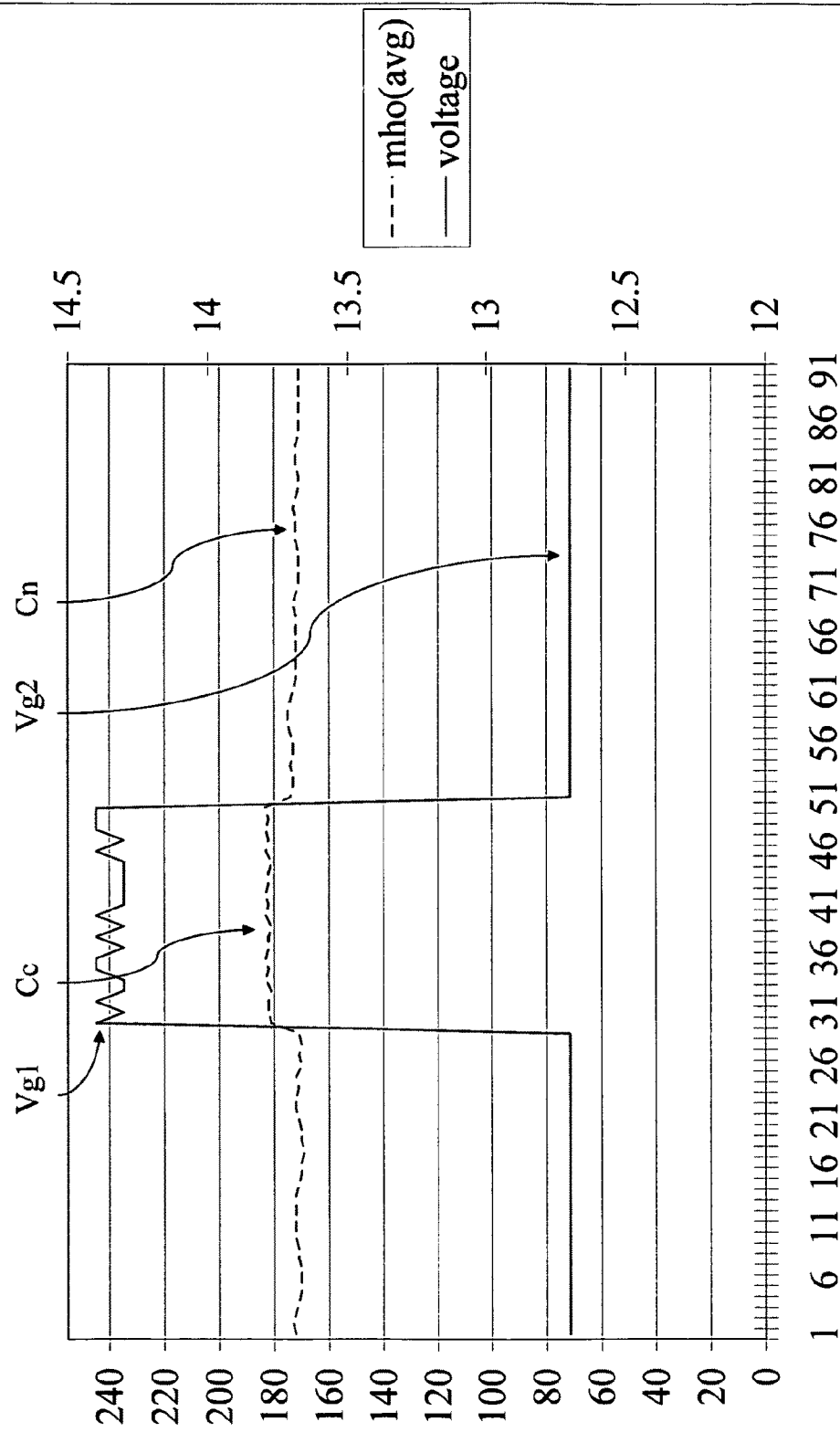
FIG. 5 is an idealized plot of voltage across and internal conductance of a typical nearly new battery over time, illustrating the variation in voltage and internal conductance while the battery is being charged and when fully charged, but after charging.
Figure 6:
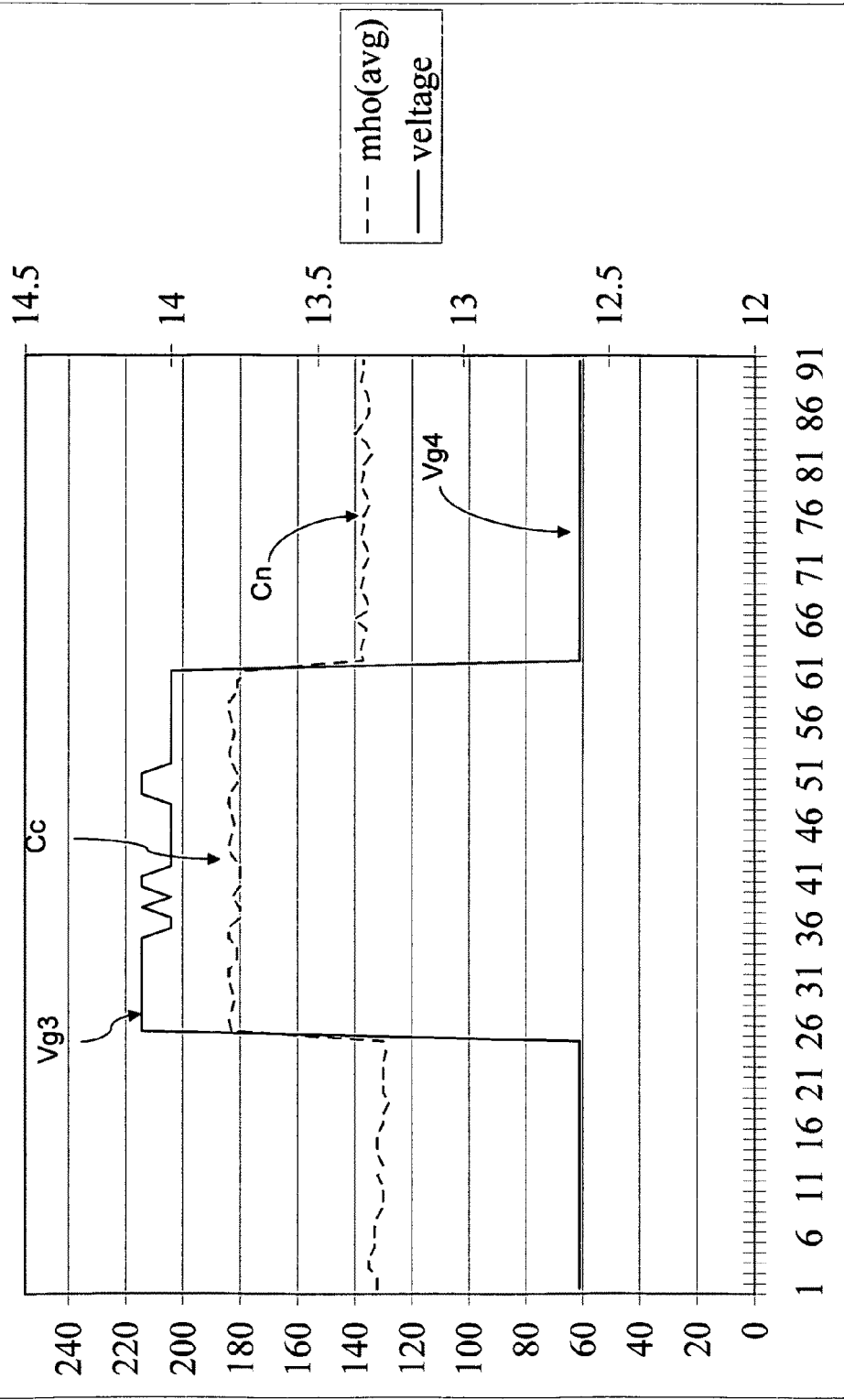
FIG. 6 similarly plots sampled voltage and internal conductance of a battery near the end of its useful life.
Figure 9:
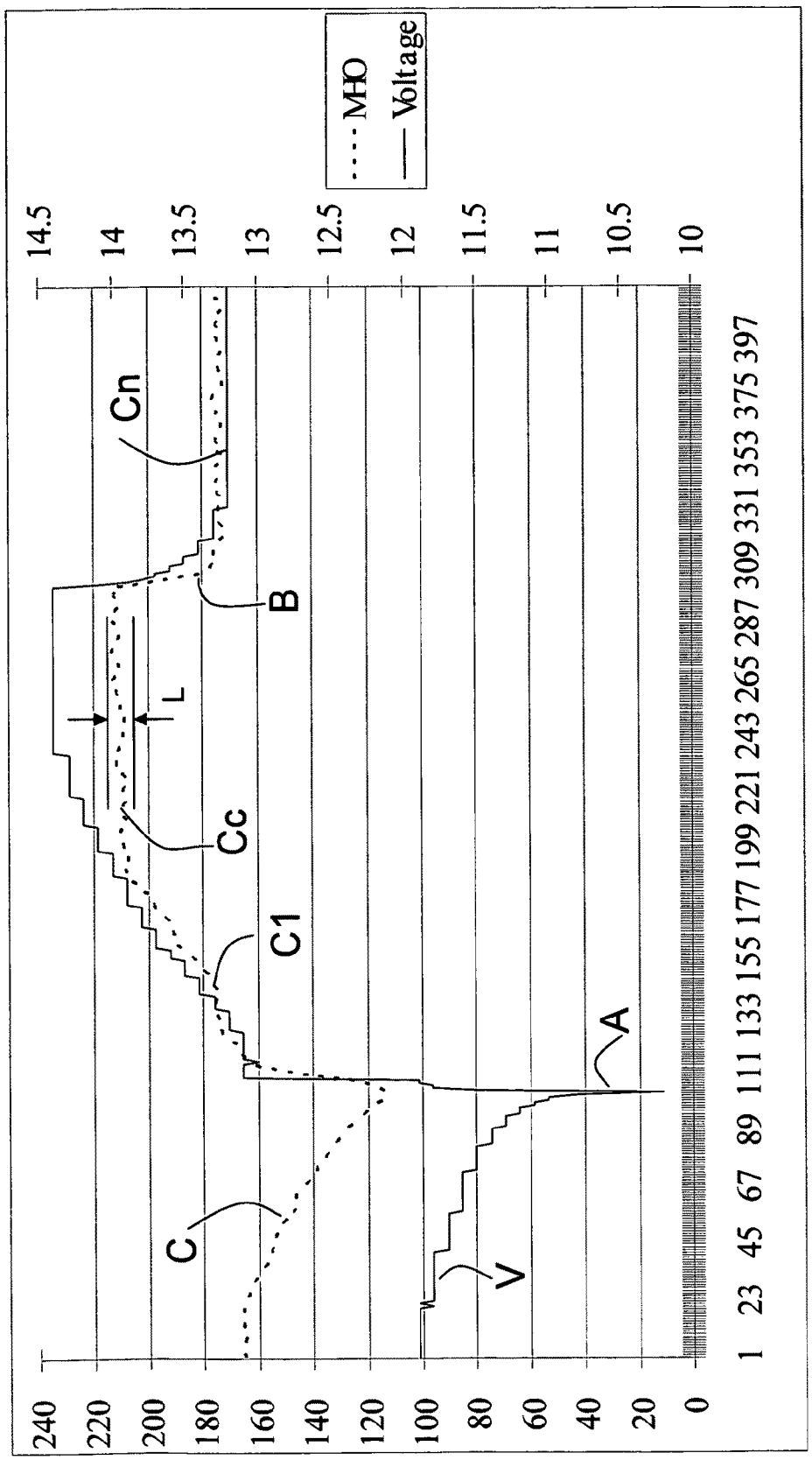
FIG. 9 shows a further plot, comparable to FIGS. 4 and 5, illustrating further subtleties in variation of battery conductance and voltage during charge and discharge cycles.

Comparison of FIGS. 5 and 6 illustrates the discovery that is utilized by the method and instrument of the invention for evaluating the condition of a battery. FIGS. 5 and 6 each plot voltage measured across a battery by a solid line, with the units on the right side of the diagram. (Note that these are "cleaned-up" plots of measured data, for clarity.) The internal conductance is shown by a dashed line, with the units in mhos on the left side of the diagram. Both diagrams represents measurements taken over a period of approximately 90 minutes, with measurements taken at one-minute intervals. FIG. 5 illustrates these measurements for a nearly new battery, in service for two months, while FIG. 6 shows comparable measurements for a battery of similar nominal characteristics that is relatively old, specifically one having been in service for twenty months. FIG. 9, discussed in detail below, is a comparable plot showing further detail relevant to additional aspects of the invention.

FIGS. 5 and 6 show plots of the voltage across and the conductance of a fully-charged battery, as measured while the battery is being charged, and before and after charging. In FIG. 5, the voltage Vg1 during charging is approximately 14.4, which takes place from minutes 29 through 51, and the voltage Vg2 is approximately 12.75 both before and after charging. In FIG. 6, the voltage Vg3 is approximately 14 during charging, from minutes 25-61, while the voltage Vg4 before and after charging is approximately 12.6. As shown in both plots, the conductance of the battery increases during charging; that is, Cc (using this variable name here to refer to the conductance of the fully-charged battery as measured during charging) is greater than Cn (referring correspondingly to the conductance of the battery as measured when fully charged, but after charging). However, as is immediately apparent from comparison of FIGS. 5 and 6, the difference between Cc and Cn is much more pronounced with respect to the battery in poor condition of FIG. 6 than with respect to the newer battery of FIG. 5. This fact appears to have been discovered by the present inventors, and the present invention makes use of this discovery to provide a method and instrument for evaluating the condition of a battery.

More particularly, as discussed more fully below, this discovery can be combined with the "self-learning" ability of a battery evaluation device operating in accordance with the discussion of FIGS. 1 and 3 above to provide battery evaluation capabilities far beyond anything possible in the prior art. Preferably, the conductance Cn of the fully-charged battery after charging is employed as the capability value Ce used to determine SOH according to the FIGS. 1 and 3 technique.

Figure 9A:
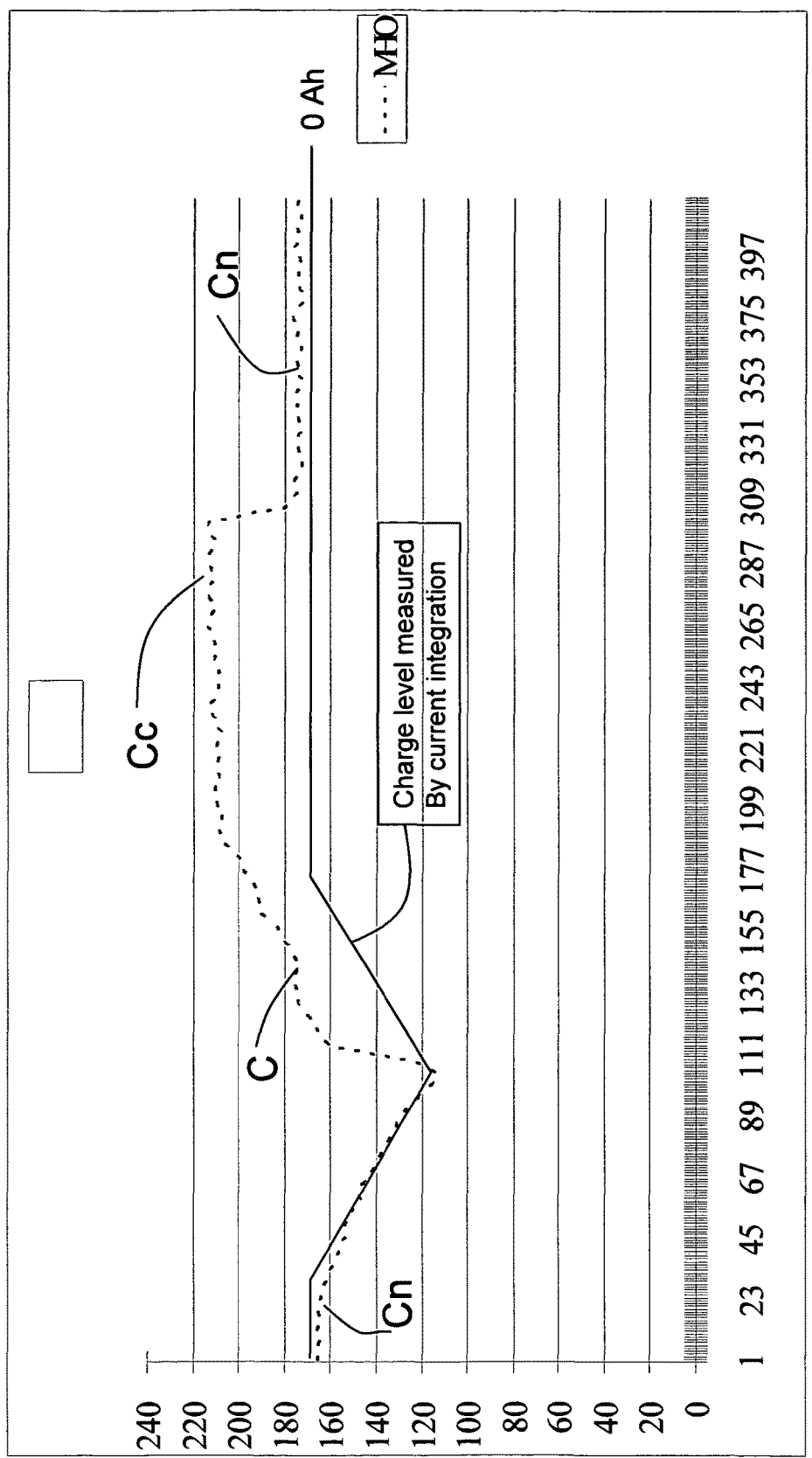
FIG. 9A shows a plot of conductance versus time during charge and discharge cycles, as in FIG. 9, and also shows the integrated current flow.

It will also be observed from FIG. 6 that the conductance of the older battery is somewhat greater after charging than previously. The prior art, as noted, teaches measurement of the internal resistance (or conductance) of a battery to evaluate its condition, and this plot shows that this might be effective in evaluating the battery's state of charge SOC. FIGS. 9 and 9A address the use of measurement of conductance in evaluation of SOC in further detail. However, it will be appreciated by those of skill in the art that the difference in conductance before and after charging is relatively subtle and might easily be masked by other effects, e.g., change of temperature and the like. By comparison, the difference between Cc and Cn is quite pronounced and lends itself well to robust techniques for evaluation of SOH.

Thus, in addition to evaluating the condition of the battery in accordance with FIGS. 1 and 3, which requires tracking changes in the battery's condition over time, according to the discovery of the invention, the SOH of a fully-charged battery can be evaluated by dividing Cn by Cc to yield a percentage value SOHactual. If desired, SOHactual can be compared with a corresponding value SOHnominal representative of the condition of a new battery to indicate the actual condition of the battery. Thus, if it is determined that the battery is to be considered to have reached the end of its useful life when its effective capability Ce has declined to 0.6 of its maximum capability Cm, an end-of-life value Ceol=0.6 Cm may be established. If SOHactual is then equal or less than 0.6 SOH nominal, an indication may be given that the battery should be replaced. If SOHactual is instead to be expressed as a percentage, so that SOH=100% for a new battery and SOH=0% for one at the end of its useful life, SOH can be calculated as (Cn−0.6 Cc)/(Cc−0.6 Cc).

In the example of FIG. 5, curve Cc has an average value of about 181 mho during charging, and curve Cn has an average value of about 170 mho after charging. Cn/Cc, representing the actual condition of the test battery obtained by the method of the invention, is 0.944; expressed as a percentage, this is 94.4%. Knowing that this battery is relatively new, this value can be taken as SOHnominal, to which corresponding values for batteries of unknown condition may be compared.

In FIG. 6, curve Cc has an average value of about 182 mho during charging, and curve Cn has an average value of about 130 mho after charging. Cn/Cc, representing the actual condition of the test battery as evaluated according to the invention is thus 0.714 or, expressing this as a percentage, SOHactual is 71.4%. This can be compared to the corresponding value SOHnominal to determine whether the battery is usable; the value measured in the example would be taken to indicate that the battery was only marginally useful. Typically, a signal will be given to indicate that a used battery should be replaced with a new one if its measured internal resistance Cn is less than 60% of Cc; the exact value of the percentage is decided depending on the type of the battery to be measured.

It will further be appreciated from comparison of FIGS. 5 and 6 that Cc is essentially identical for a new battery and a well-used battery. This fact is highly significant in application of the invention, as it means that Cc can be measured at any time during the lifetime of a battery, simply by charging the battery and measuring its conductance, and compared to Cn, the conductance measured after charging, to determine the relative condition of the battery. Accordingly, it is not required to input a value for Cc of a new battery, nor a value for SOHnominal. This means furthermore that the technique of the invention for determining SOH of the battery can be applied to any fully-charged battery at any time without more information being provided.

Figure 7:
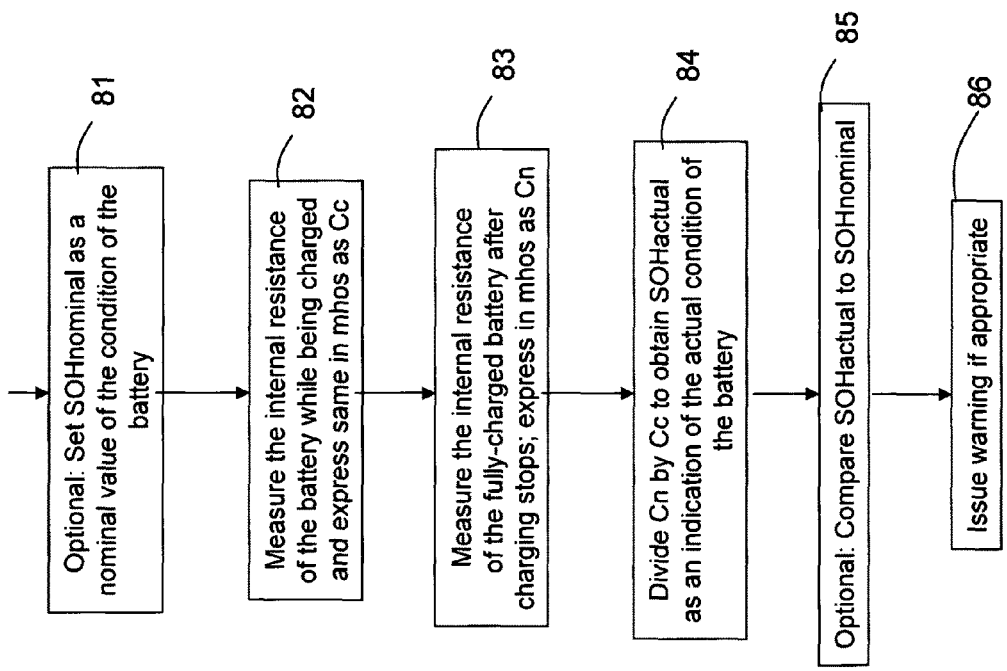
FIG. 7 shows a simplified flowchart of the steps in one method of evaluating the condition of a battery according to the invention.

FIG. 7 shows the principal steps in the method of the invention for evaluating the condition, that is the state of health, or SOH, of a battery, responsive to the above discovery. In step 81, which is optional as above, a predetermined value (i.e., SOHnominal) is chosen representative of the condition of a new battery. In step 82, the conductance of a fully-charged battery is measured while charging continues, and is expressed in mhos as Cc. In step 83, the conductance of the battery is measured after charging is complete, and is expressed in mhos as Cn. In step 84, Cn is divided by Cc to obtain SOHactual as an indication of the actual condition of the battery. If a value for SOHnominal was provided in step 81, SOHactual can be compared thereto in step 85. In step 86 a warning can be issued if battery failure is imminent.

Figure 8:
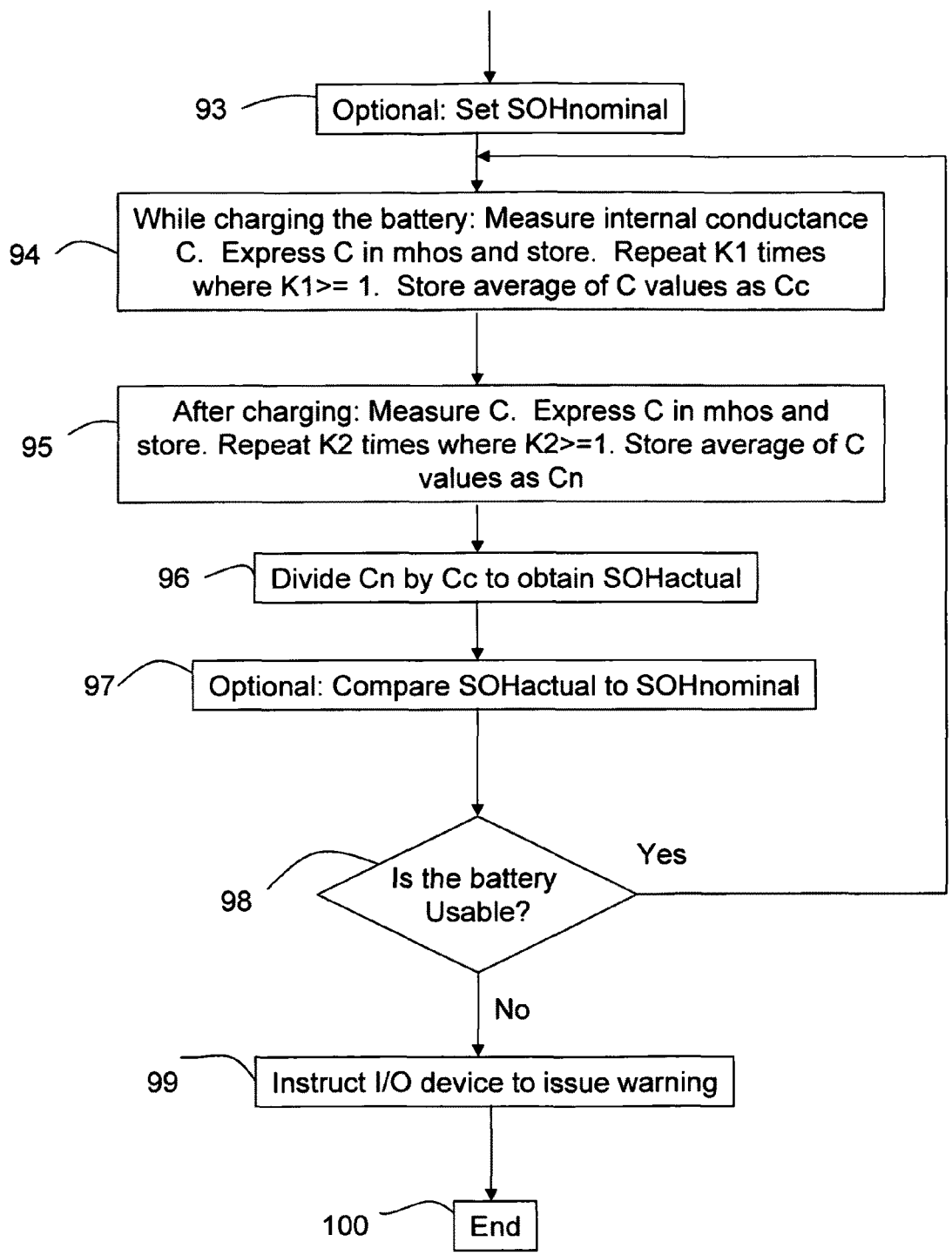
FIG. 8 shows a more detailed flowchart corresponding to FIG. 7.

FIG. 8 shows a more detailed flow chart with respect to the method of the FIG. 7. In step 93, corresponding to step 81 of FIG. 3, a value SOHnominal corresponding to the SOH of a new battery may optionally be set. In step 94, a charging device is used to charge the battery, and, when the battery is fully charged (determined as discussed further below), the conductance C of the battery is measured, expressed in mhos, and stored in memory. In order to improve the accuracy of the value, the measurement is preferably performed a plurality K of times and an average taken and stored as Cc. In step 95, charging is stopped, and the conductance of the battery is measured, expressed in mhos, and stored in memory; again it is preferable that an average value be stored as Cn. In step 96, Cn is compared to Cc to obtain a percentage value SOHactual indicative of the actual condition of the battery. If a value was provided for SOHnominal, it is compared in step 97 with SOHactual. In step 98, a determination is made whether the battery is usable or not based on the comparison, or simply responsive to SOHactual. If the battery is not usable, an I/O device (e.g., a warning light) is instructed to issue a warning. Note that in the automotive context, where charging is essentially continuous while the engine is running, Cc will be measured repeatedly while the engine is running and Cn when the engine is shut off. As discussed below in connection with FIG. 9, it will typically be preferred to delay measurement of Cn for a few minutes after charging ceases, to allow "surface charge" leading to erroneous readings to dissipate. If it is then determined that SOH has fallen to a point indicating incipient failure of the battery, a corresponding alarm signal can be given.

FIG. 9 is a diagram displaying variation in voltage across a battery and its conductance over a period of some 400 minutes, as the battery is first discharged through a heavy load, is then charged, and is then quiescent. As in FIGS. 5 and 6, the conductance C is shown by a dashed line, in units of mho as indicated on the left side of the graph, and battery voltage V by a heavier line, in units of volts as indicated on the right side. Again, the drawing is a "cleaned-up" version of actual data.

The battery is first discharged by connection to a heavy load, from minutes 1 through 106. As can be seen the voltage V and conductance C both drop rapidly as the battery becomes discharged. At minute 106, the load is removed and a charger connected. As marked at A on the diagram, V rises rapidly from approximately 10 volts to 13.2 volts when the charger is initially connected, and then rises much more slowly, over a period of approximately two hours, to a final value of nearly 14.5 volts. The conductance C also initially rises rapidly when the charger is first connected, but thereafter rises in a non-linear fashion, eventually reaching a stable value Cc of approximately 210 mho. The battery may be taken to be fully charged when C reaches a relatively stable value, e.g., when the variation in a succession of measurements is less than an arbitrary value L. As indicated by FIG. 9, there is some noise in the conductivity signal and relatively sophisticated signal processing techniques may be called for in order to obtain the best possible values for C.

At approximately minute 295, point B, the charger is disconnected, but no load is connected. The voltage V falls gradually to a final value over a period of some tens of minutes, as the "surface charge" on the plates dissipates and the battery thus reaches equilibrium. The conductivity C similarly drops gradually, eventually reaching a value Cn that is accurately indicative of the energy stored in the battery. It is this value Cn that can be compared to Cc to evaluate the SOH of the battery, and which should be employed as the present capability Ce in the method of FIG. 3, e.g., applying the analysis explained with respect to FIG. 1(a) and resulting in the fuel gauge display of FIG. 1(b). Moreover, by storing Cn as measured after the battery has reached equilibrium after charging for comparison with C as measured later, the SOC of the battery can also be determined.

As discussed above, the ABMS technique as described with respect to FIGS. 1 and 3 is "self-learning" in the sense that a maximum capability value Cm is automatically stored and updated, such that the monitor of the invention "learns" the maximum capability of the associated battery; combined with ongoing measurements of voltage and conductance, this Cm value allows SOH to be determined for any battery, in substantially any condition, and thereafter allows its useful remaining life to be predicted accurately. Ca can also be measured regularly and compared to Ce to yield a value for SOC. Further, by measuring Cn after the battery has been charged, the device is "self-calibrating" as well. The self-learning and -calibration attributes of the present invention overcome significant shortcomings of the prior art because sensors made according to the present invention can be installed on a wide range of battery sizes, types, and ages in a wide range of use situations and very quickly can 'learn' the key attributes of the battery and begin reporting useful SOC and SOH information.

As can be seen from FIG. 9, while the battery is discharging (minutes 1-106) the conductivity curve C is relatively linear, such that a calculation of SOC comparing C to a previously established value for Cn would yield a relatively accurate value for SOC; by comparison, a similar calculation performed during recharge, e.g. minutes 106-209, would not be as accurate due to the relative nonlinearity of the change in C.

Where SOC must be understood to a very high degree of accuracy, e.g., as in the start/stop vehicles discussed above, a traditional "shunt" or "VIT" sensing circuit can be combined with data provided according to the invention to provide continuous, highly accurate SOC information. As described above, prior art VIT sensors produce highly accurate current flow information, but have difficulty correlating that information to battery SOC over time without knowing other important unique information about the battery. By combining the self-learning and self-calibrating attributes of the previously described embodiments with current flow information from a simple shunt measuring current into and out of the battery, a battery sensor device with higher SOC accuracy can be provided. Additionally, from a combination of real time internal resistance measurement during discharge, and actual current integration during the same discharge period, the total absolute capacity of the battery can be determined.

FIG. 9A repeats the same curve C as in FIG. 9, omits the curve V for clarity, and adds a solid charge/discharge curve indicating the integrated flow of charge into and out of the battery. Charge flow can be measured by a shunt, Hall-effect sensor, inductive coil, or other means well known to the art, and the integration carried out in the system microprocessor control unit (MCU) (discussed below in connection with FIG. 11.) Thus, a value for SOC established when the battery is fully charged from time to time can be continually updated and maintained accurate. As illustrated, typically the integrated charge will vary linearly during discharge and charge, but the accuracy of the calculated value for SOC does not depend upon linearity nor constant rate of flow, as the flow is measured directly.

More particularly, each time a value for Ce (or Cn, where internal conductance is used as the measure of capability) is established and stored in memory, that is, each time the battery is charged, SOC is set to 100%. Thereafter, the shunt is used to measure flow of current into and out of the battery, allowing effective tracking SOC by integration of current. A target maximum depth of discharge level Cdod can be set, based on Cm, and used to control recharging as necessary. For example, in the start/stop vehicle context, SOC can be tracked and used to start the engine to recharge the battery when Ca=Cdod, that is, before the battery reaches a depth of discharge at which it will be unable to do so.

Furthermore, over a sufficient period of time (as short as a few minutes to as long as a few hours), the decrease in measured conductance C and the accumulated actual current discharge Ci can be correlated, and the total absolute capacity of the battery can be calculated. Stated differently, in order to evaluate SOH one need simply divide Cn by Cc, as above, but this does not give one an actual value for the amount of charge in the battery. However, if one measures the actual amount of current flowing into or out of the battery while tracking the change in its conductance C, one can derive an accurate value for the actual capability of the battery. Once the absolute capability range (full to empty, Ce to Cdod) is established, as above, at every full charge instance a new value for Ce can be established and the current integration process started again.

In this way, a highly accurate value for SOC can be provided at any given time. Moreover, because the process of current integration is restarted every time the battery is fully charged, the accumulation of excessive errors is avoided; the process is thus both self-learning and self-calibrating. This allows the process to be used to evaluate batteries of unknown nominal size and condition. Furthermore, as the battery ages and SOH naturally decreases, the utility and accuracy of providing correct SOC information by integrating current flow remains high.

An analogy may be helpful. Suppose that a battery is a tank for water, of unknown initial capability Cm, but having a simple gauge indicating the degree to which it is filled. Over time its capability has decreased, as if filled to an unknown degree with gravel, such that its present capability Ce is also unknown. The tank is first filled, and its level Ce recorded. It is then gradually emptied while the quantity of water released is integrated. At some later time its relative level Ca is again recorded. Ca/Ce indicates the degree to which the tank has been emptied; if this is 50%, and ten gallons of water has been released, then Ce is 20 gallons. Henceforth, starting each time the tank is refilled, one can subtract the amount of water released from 20 gallons to determine the exact amount of water remaining. This is equivalent, of course, to the SOC of a battery. Moreover, because as above in the battery case we can determine the relative SOH of the battery by comparing Cn to Cc (which would not be possible in the water tank analogy) we can also determine the initial maximum capability Cm, which would have been substantially equal to Cc.

Figure 10:
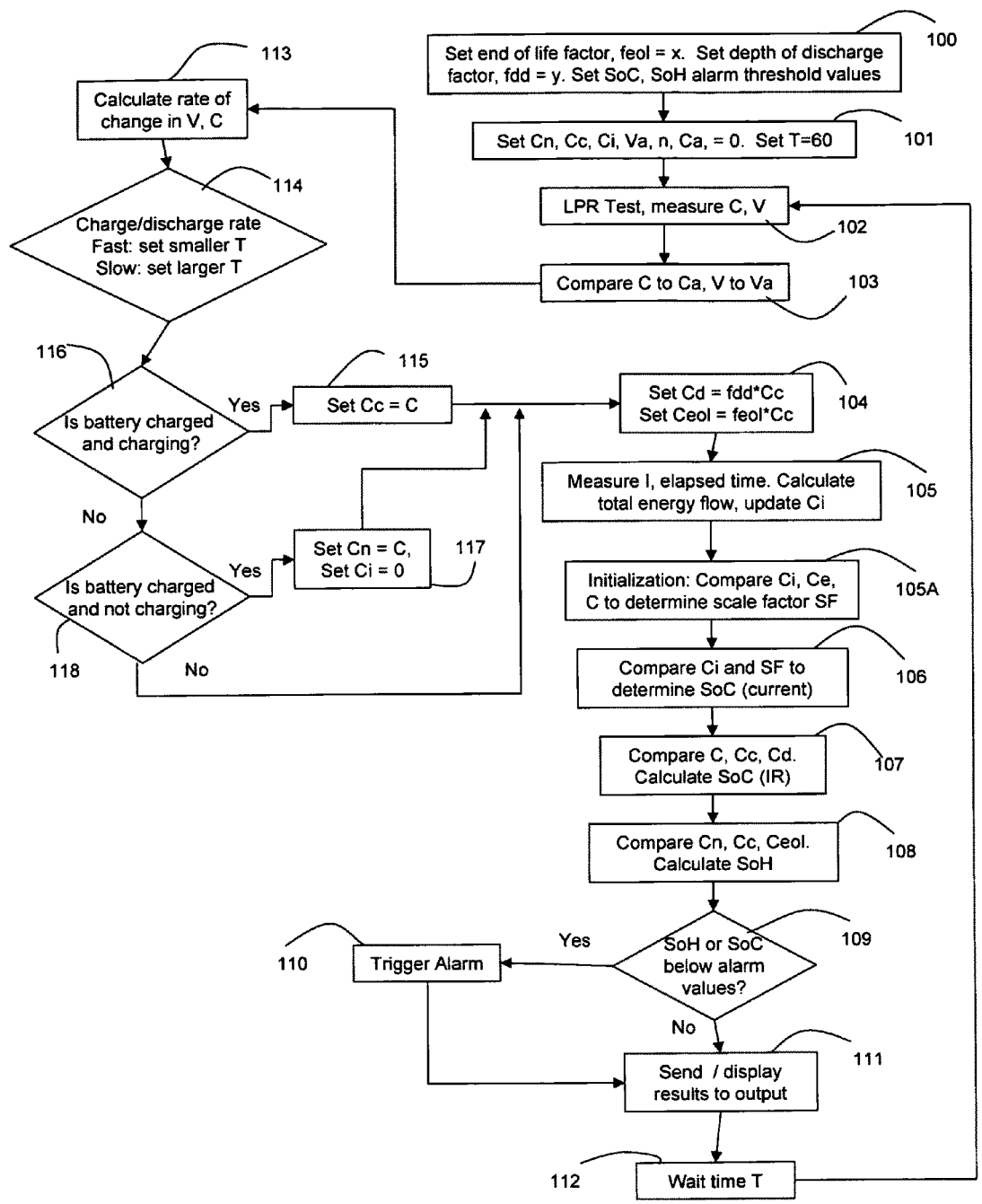
FIG. 10 is a flowchart comparable to FIG. 3, showing schematically an exemplary algorithm for employing the integrated current flow and variation in conductance of a battery to evaluate its condition, illustrating the self-learning and self-calibrating attributes of the device.

FIG. 10 shows a flowchart of the steps in an exemplary algorithm for performing this calculation. Many of the steps here are substantially identical to those in FIG. 3 and their description here will be abbreviated accordingly. It will further be appreciated that many modifications and variations are possible.

Thus, steps 100 and 101 initialize the variables used. In step 102, the conductance C and voltage V of a battery under test are measured. This may be accomplished using the LPR test disclosed in U.S. patent application Ser. No. 11/984,669, and summarized again below, or by another method for measuring C and V, if suitable. These are compared in step 103 to stored values Ca and Va, and their rate of change is determined in step 113; in step 114, this is used to set the interval T at which the process is repeated. Step 116 determines whether the battery is then fully charged and charging; if so, Cc is set equal to the measured value C in step 115. If not, but if the battery is charged but not being charged, determined at step 118, Cn is set equal to C, and Ci (the value of the integrated current, as measured across a shunt or otherwise, as above) is set equal to zero. If the battery is not fully charged, control goes directly to block 104, where Cd (representing the maximum depth of discharge to be permitted) is set equal to fdd*Cc, and Ceol is set equal to feol*Cc. (Cc is used as the reference value for these quantities so that the end-of-life target value Ceol and the maximum permissible depth of discharge value Cd do not vary as the battery ages.) Thus the capability values to which C is repetitively compared are updated to reflect the state of the battery when it is fully charged from time to time, thus "self-calibrating" the device such that errors in current integration, for example, do not accumulate over time.

At step 105, the current I through the shunt is measured and multiplied by the elapsed time T to yield an integrated value for the total energy flow, and Ci is updated accordingly. In step 105A, which may be performed upon initialization of the device at installation, or from time to time during its use, a scale factor SF is determined for conversion of the value for the integrated flow of current Ci to values for capability, as typically determined responsive to measurements of the conductance of the battery. The scale factor SF can be determined as discussed below. In step 106, Ci is compared to SF to determine the instantaneous value for SOC (current), that is, to derive a value for SOC responsive to measurement of the current flow Ci. In step 107, SOC can be determined as a function of conductivity, e.g., to confirm the conversion value SF. In step 108 Cn, Cc, and Ceol are compared to determine SOH. In step 109, SOC and SOH are compared to alarm limits, and an alarm given at 110 if appropriate. Otherwise, the results may be displayed on an output device at step 111. The process is repeated after an interval T, as indicated by step 112.

More specifically, if it is desired to provide an ongoing value for SOC based on measurement of the flow of current, it is necessary to determine the amount of current corresponding to discharge of the battery from 100% SOC to 0% SOC. However, obviously it would be undesirable to do so by completely discharging the battery while measuring the total amount of current provided. Instead, according to one aspect of the invention, the process of the invention includes performance of an initialization step to determine the relation between the flow of charge and the change in conductance. For example, the Cn of a fully charged battery can be stored, and a value for Cdd determined as fdd*Cn. Thus Cdd corresponds to 0% SOC. The fully-discharged battery need then only be partially discharged, while the current flow is integrated and the change in conductance of the battery monitored; the amount of current flow corresponding to a discharge of 0% SOC can then be predicted. For example, if Cn were 200 MHO, and fdd were 0.5, Cdd would then be 100 MHO. Suppose a total current flow of 10 A was recorded while C dropped to 150 MHO. SOC would then be 100−[(200−150)/(200−100)], or 50%; from this it will readily be seen that the total current required to discharge the battery from 100% SOC to 0% SOC would be 20 A. This establishes the scale factor SF to be employed thereafter with respect to that particular battery. In this example, SF is 5, i.e. multiply the measured current by 5 and subtract that number of mhos from Cc to obtain C, which is then compared to Cdd to yield SOC. Thereafter, each time the battery is known to be fully charged, SOC can be reset to 100%, and current flow monitored thereafter to track SOC over time.

Diagnostic Charging System

Figure 11:
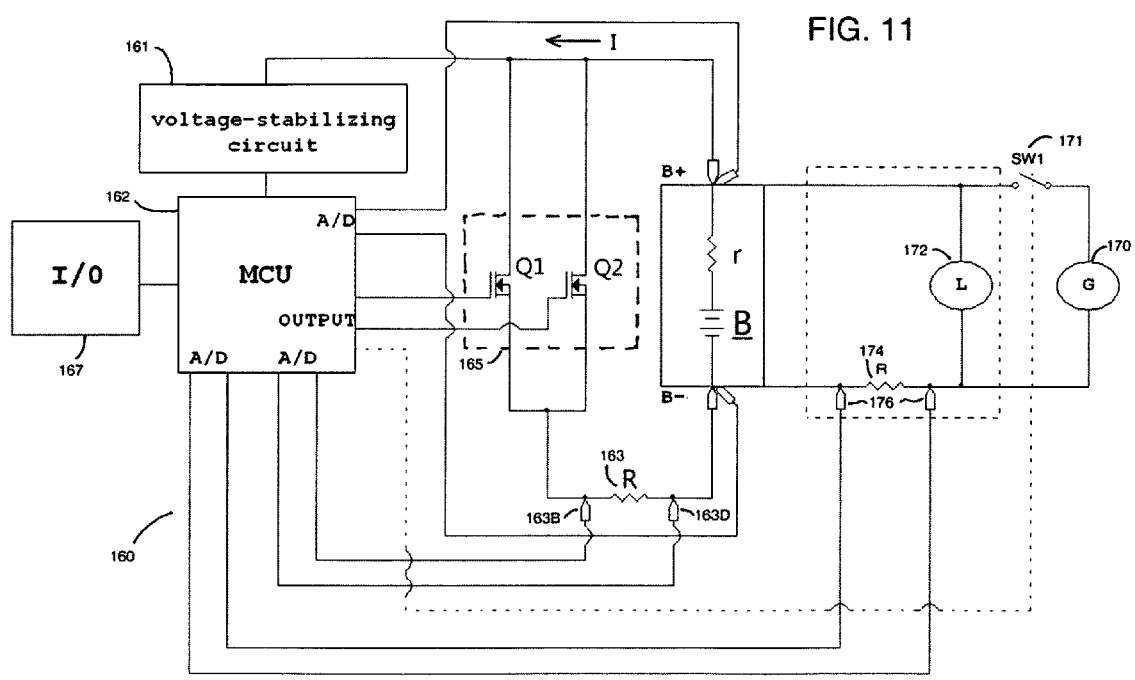
FIG. 11 shows a schematic diagram of a circuit for an instrument implementing the invention.

FIG. 11 shows an electrical block diagram of an apparatus 160 for evaluating the condition of a battery according to the invention. The basic circuit and technique used for measuring the conductance of the battery is as disclosed in U.S. patent application Ser. No. 11/984,669. The apparatus 160 comprises a voltage-stabilizing circuit 161 for supplying a stable voltage to the apparatus 160 in operation, a MCU (microprocessor control unit) 162 for controlling the apparatus 160 and for measuring the voltage at several points in the circuit connected to MCU 162 at analog to digital (A/D) inputs, an known load resistance of value R 163, a transient current control circuit 165, and an I/O (input/output) unit 167. The I/O unit 167 can be implemented in a number of ways familiar to those of skill in the art, e.g. as one or more of a display, a keyboard input, a wireless communication device, and wireless access to the Internet.

More specifically, the apparatus 160 comprises a transient current control circuit 165 implemented as two parallel transistors Q1 and Q2, each representing a controllable load, connected so that either one or both of Q1 and Q2 can be caused to draw current from the battery B through a known resistance R 163. Large "transient" currents (that is, large currents drawn for a very short time, so as to limit the amount of power dissipated) are controllably drawn from the battery B to be evaluated by the first and second transistors, responsive to control signals from the MCU 162. If only Q1 is conductive, a reference load voltage $V_{LR}$ can be measured across R using connections 163B and 163D; then Q2 can be caused also to conduct. Because Q1 and Q2 are in parallel, and have internal resistance, a different amount of current will be drawn, and a different load voltage $V_{LL}$ measured across R. The current I drawn from the battery can then be calculated by the MCU by dividing the difference between $V_{LR}$ and $V_{LL}$ by R. $V_{BR}$, the voltage across the battery measured while only Q1 is conducting, and $V_{BL}$, the voltage measured while both Q1 and Q2 are conducting, will have been measured at the same times. The internal resistance r of the battery is then calculated, by dividing the difference between $V_{BR}$ and $V_{BL}$ by 1. Further details of the measurement of the internal resistance can be found in Ser. No. 11/984,669, incorporated herein by this reference. The calculated value for the internal resistance r of the battery is then inverted to yield the conductance C.

According to one aspect of the present invention, the FIG. 11 circuit is also shown connected to a charger G or other source of energy 170 by a switch SW1 171 operated responsive to a associated control line 168. The connection of the service load L 172 is also shown, as is a shunt resistance 174 with a pair of voltage-sensing connections 176 provided to measure the current flowing into or out of the battery B.

In the following example, we assume that it is desired initially to determine the condition of a battery installed in an automobile, and thereafter to track its condition and control its charging. The instrument is connected to the battery, ideally via Kelvin connections, as illustrated in FIG. 11. The internal conductance is measured first, using the techniques disclosed in detail by Ser. No. 11/984,669, to establish its Ce. The source of charge 170 is then energized, to charge the battery; charging continues until the voltage and/or conductance stabilizes. SOC is then taken to be 100%. The value of the conductance is then stored as Cc, and the charger is deenergized; after a time sufficient to allow the surface charge to dissipate (or after the measured voltage has stabilized, indicating dissipation of the surface charge), the value of the conductance is measured again and stored as Cn. SOH can then be determined by comparing Cn and Cc. SOC can then be tracked in future, by monitoring the current into and out of the battery, using voltage sensing leads 176 to measure the voltage drop across a shunt 174 of known resistance, and employing this to track changes in SOC. In order to provide an accurate measure of the remaining charge, an indication of the actual capacity of the battery (as opposed to the "relative" capacity given by SOH) can be derived. As above, this can be done by monitoring the amount of charge flowing into and out of the battery over time and measuring the actual change in its conductance. The I/O device can be controlled by the MCU, e.g., to provide an output indicating the SOH and SOC of the battery; for example the SOC can be displayed as a percentage value, or a value for the remaining amount of energy stored in the battery can be displayed.

To those of skill in the art many additional aspects of the invention and improvements and developments that can made thereto will be apparent. In particular, various aspects of the battery evaluation processes and equipment disclosed herein can be combined in various ways to yield devices of differing desired characteristics, including but not limited to battery chargers that optimize the charge rate, battery evaluation equipment for determining SOH of batteries of unknown provenance, charge and engine starting control systems for start/stop vehicles, battery monitoring and charge source control systems for boats, military vehicles, trucks, RVs and the like having multiple batteries and charging sources, battery monitors for passenger cars, and many others. Accordingly, while several specific embodiments of the invention have been described in detail, the invention is not to be limited thereto, but only by the following claims.

What is claimed is:

1. A method for tracking the state of health and state of charge of a particular battery as it experiences numerous charge/discharge cycles over its lifetime, comprising the following steps:

providing an instrument to be connected to the particular battery and capable of evaluating a parameter indicative of the capability of the particular battery at intervals during charge/discharge cycles over the lifetime of the particular battery and of storing the values of said parameter, and using said instrument to perform the following steps, performed without operator intervention:

evaluating said parameter indicative of the capability of the particular battery at intervals during charge/discharge cycles experienced by the particular battery, yielding a series of values Ca;

tracking the series of values evaluated for Ca during a particular charge/discharge cycle experienced by the particular battery, and selecting the maximum value reached in the series of values as Ce;

tracking the values reached by Ce over the lifetime of the particular battery and selecting the maximum value reached as Cm;

determining the state of health of the particular battery by comparing Ce and Cm; and determining the state of charge of the particular battery by comparing Ca and Ce, or by comparing Ca to Cm.

2. The method of claim 1, comprising the further step of predicting incipient battery failure by comparing Ce to a predetermined value Ceol.

3. The method of claim 2, wherein Ceol is set as a predetermined fraction of Cm.

4. The method of claim 1, comprising the further step of controlling charging of said battery by comparing Ca to a predetermined value Cdod for maximum permissible depth of discharge.

5. The method of claim 4, wherein Cdod is set as a predetermined fraction of Cm.

6. The method of claim 1 wherein said parameter indicative of the capability of the battery is its DC internal conductance.

7. The method of claim 1, wherein Ce is determined by performance of the following steps:

applying charging current to the battery, until it is determined that the battery is substantially fully charged;

discontinuing application of charging current to the battery;

measuring said parameter indicative of the capability of the battery Cn of the fully-charged battery when charging current is no longer being applied; and setting Ce equal to Cn.

8. The method of claim 7, wherein said step of measuring said parameter indicative of the capability of the battery Cn of the fully-charged battery when charging current is no longer being applied is performed when the battery has reached equilibrium after charging.

9. An instrument for being connected to a particular battery for tracking the state of health and state of charge of said particular battery over its lifetime, comprising:

a measuring circuit for measuring a parameter indicative of the capability of the particular battery and for providing a signal responsive to a measured value of said parameter at intervals during each charge/discharge cycle of said particular battery, yielding a series of values Ca; and a controller responsive to said measuring circuit for monitoring said series of values Ca, and for performing the following steps without operator intervention:

tracking the series of values for Ca during each charge/discharge cycle of said particular battery, and selecting the maximum value reached in each series of values as Ce;

tracking the values of Ce over the lifetime of the particular battery and selecting the maximum value reached by Ce over the lifetime of the particular battery as Cm;

determining the state of health of the particular battery by comparing Ce and Cm; and determining the state of charge of the particular battery by comparing Ca and Ce, or by comparing Ca and Cm.

10. The instrument of claim 9, wherein said controller further predicts incipient battery failure by comparing Ce to a predetermined value Ceol.

11. The instrument of claim 10, wherein Ceol is set as a predetermined fraction of Cm.

12. The instrument of claim 9, wherein said controller further controls charging of said battery by comparing Ca to a predetermined value Cdod for maximum permissible depth of discharge.

13. The instrument of claim 12, wherein Cdod is set as a predetermined fraction of Cm.

14. The instrument of claim 9, wherein said measuring circuit measures the DC internal conductance of the battery.

15. The instrument of claim 9, further comprising a controllable device for applying charging current to said battery, said device being responsive to said controller, wherein said controller determines Ce by performance of the following steps:

causing charging current to be applied to the battery, while monitoring the condition of the battery until said controller determines that the battery is substantially fully charged;

discontinuing application of charging current to the battery;

measuring said parameter Cn of the fully-charged battery when charging current is no longer being applied, and setting Ce equal to Cn.

16. The instrument of claim 15, wherein said controller further determines when the battery has reached equilibrium after charging and then measures said parameter Cn of the fully-charged battery when charging current is no longer being applied.

* * * * *